US00RE38363E

(19) United States
(12) Reissued Patent
Gocho et al.

(10) Patent Number: US RE38,363 E
(45) Date of Reissued Patent: Dec. 23, 2003

(54) METHOD OF FORMING TRENCH ISOLATION HAVING POLISHING STEP AND METHOD OF MANUFACTURING SEMICONDUCTOR DEVICE

(75) Inventors: Tetsuo Gocho, Kanagawa (JP); Hideaki Hayakawa, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

(21) Appl. No.: 09/041,275

(22) Filed: Mar. 12, 1998

Related U.S. Patent Documents

Reissue of:
(64) Patent No.: 5,498,565
Issued: Mar. 12, 1996
Appl. No.: 07/981,831
Filed: Nov. 25, 1992

(30) Foreign Application Priority Data

| | | |
|---|---|---|
| Nov. 29, 1991 | (JP) | 3-340260 |
| Nov. 29, 1991 | (JP) | 3-340269 |
| Dec. 30, 1991 | (JP) | 3-360530 |
| Jan. 27, 1992 | (JP) | 4-035676 |
| Sep. 30, 1992 | (JP) | 4-285052 |

(51) Int. Cl.[7] ..... H01L 21/762
(52) U.S. Cl. ..... 438/427; 438/692
(58) Field of Search ..... 438/424, 427, 438/695, 691, 692, 959, 697, 699, 734, FOR 227, DIG. 50, DIG. 85, DIG. 86

(56) References Cited

U.S. PATENT DOCUMENTS

| | | | |
|---|---|---|---|
| 4,836,885 A | | 6/1989 | Breiten et al. |
| 5,182,221 A | * | 1/1993 | Sato |

FOREIGN PATENT DOCUMENTS

| | | | |
|---|---|---|---|
| EP | 0407047 | * | 1/1991 |
| EP | 0424608 | * | 5/1991 |
| JP | 59-163817 | * | 8/1984 |
| JP | 1-28925 | * | 1/1989 |
| JP | 1-84634 | * | 3/1989 |
| JP | 2-159050 | * | 6/1990 |
| JP | 2-294050 | * | 12/1990 |
| JP | 3-139860 | * | 6/1991 |
| WO | WO86/02777 | * | 5/1986 |

OTHER PUBLICATIONS

Wolf, S., Silicon Processing for the VLSI Era, Process Integration, vol. 2, 1990, Lattice Press (pp. 225–229).*
Machida, K., et al., "SiO2 Planarization . . . Interconnects", J. Vac. Sci. Tech. vol. 4, No. 4, pp. 818–821, Jul. 8, 1986.*
Wolf, S., "Silicon Processing for the VLSI Era: vol. 2, Process Integration", Lattice Press, pp. 222–224, 238–239, 225–229, 1990.*
Gocho, T., et al., "Trench Isolation Technology for 0.35 $\mu$m Device by Bias ECR–CVD", pp. 87–88, May 1992.*
Wolf, S., et al., "Silicon Processing for the VLSI Era: vol. 1, Process Technology", Lattice Press, pp. 529–533, 1986.*

* cited by examiner

*Primary Examiner*—George Fourson
(74) *Attorney, Agent, or Firm*—Sonnenschein, Nath & Rosenthal LLP

(57) ABSTRACT

A method of forming trench isolation including a burying step of burying trenches by a deposition means for conducting etching and deposition simultaneously and a polishing step of flattening a burying material by polishing is conducted by disposing an isotropic etching step, a multilayered etching stopper and a protrusion unifying structure. Polishing can be attained with satisfactory flatness uniformly or with no polishing residue even in a portion to be polished in which the etching stopper layer is distributed unevenly. The method can be applied to manufacture of a semiconductor device or the like.

2 Claims, 26 Drawing Sheets

METHOD OF FORMING TRENCH ISOLATION HAVING POLISHING STEP AND METHOD OF MANUFACTURING SEMICONDUCTOR DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention concerns a method of forming trench isolation having a polishing step and a method of manufacturing a semiconductor device having a polishing step. The present invention can be applied to the formation of trench isolation (trench type inter-device separation) in various kinds of electronic materials, a method of manufacturing various kinds of semiconductor devices braving trench isolation, as well as a method of manufacturing various kinds of semiconductor devices having a recess burying step and a subsequent flattening and polishing step. Further, it can be utilized as a method of manufacturing a semiconductor device having a polishing step including a step of burying recesses defined with a plurality of protrusion patterns (that is, defined between each of protrusion patterns) by a burying material and a step of flattening the burying material formed on the protrusion patterns.

2. Description of the Prior Art

Polishing techniques have a wide application of use and it can be utilized, for example, for flattening unevenness resulting in a substrate such as a semiconductor substrate during manufacturing a semiconductor device (refer, for example, to Japanese Patent Laid Open sho 63-39835).

On the other hand, capacitances of devices have been increased in the field of semiconductor devices and various kinds of techniques have been developed in order to increase the capacitance while minimizing chip area to as small as possible and, for example, a multi-layered wiring technique is indispensable therefor. In the multi-layered wiring technique, it is extremely important to flatten the underlying substrate in order to prevent disconnection of the multi-layered wiring. This is because unevenness on the underlying substrate, if any, will lead to occurrence of wire disconnection at a step caused by the unevenness (so-called step disconnection). In order to flatten the underlying substrate satisfactorily, flattening at the initial stage is important.

For attaining the above-mentioned object, there has been considered, for example, a flat trench isolation. Trench isolation is a technique for inter-device isolation by burying an insulator in trenches formed on a semiconductor substrate and it is advantageous for higher degree integration since fine trenches can be formed. However, after burying, i.e. filling, the trenches, it is necessary to remove protrusions of the burying material deposited at the portions other than in the trenches for attaining a flattened surface. The trench can be formed as a recess between two protrusion patterns but, when a burying material is buried, i.e. filled, in the recess (trench), since the burying material is also deposited on the protrusion patterns other than the trench to form a protruding portion, it has to be flattened. A method as shown in FIGS. 11a–11c is known as a method of forming a flat trench isolation.

In this method, as shown in FIG. 11(a), a thin silicon oxide film 2 and a thin silicone nitride film 3 are formed on a semiconductor substrate 1, then trenches 41, 42 and 43 are formed by etching using a photolithographic step and, subsequently, an inner wall oxide film, that is, the silicon oxide layer 2 is formed by oxidation to provide a semiconductor substrate.

Then, as shown in FIG. 11(b), a burying material 5 is deposited in the trenches 41–43 by a deposition means, for example, CVD to obtain a structure as shown in the figure. In this case, the burying material 5 is deposited to a large thickness also on the portions other than in the trenches 42–43 to result in protrusions 51.

Accordingly, as shown in FIG. 11(c), the protrusions 51 are removed by polishing to flatten the surface by polishing. In a case where silicone oxide is used as the burying material 5, a silicon nitride film 3 having a polishing rate lower than that of silicon dioxide may be used for instance as a stopper layer for polishing.

Such a method is applied, in addition to the trench isolation process, also to other processes for forming flat interlayer insulation films such as formation of a trench capacitor accompanying trench burying, formation of trench contact (trench plug) or formation of a layer by a blanket W-CVD process.

However, in a case where a wide recessed region (1) and a narrow protruding region (2) are formed as shown in FIG. 12(a). When polishing is applied directly after burying the trenches 41–43, the burying material 52 ($SiO_2$ or the like) that is not removed completely remains in the central portion of the burying material 5 on the wide protruding region (1), and $SiO_2$ or the like which is the burying material 52 is raised to result in occurrence of particles when the stopper layer 2 (for example) $Si_3N_4$ is removed by hot phosphoric acid in the succeeding step.

As a countermeasure for overcoming the problem, for instance, IBM has presented the following technique in IEDM in 1989 (IEDM 89, pp 61–64). That is, as shown in FIG. 13(a), a block resist 31 is formed in the recess of CVD-$SiO_2$ as the burying material 5, on which a resist coating film 3 is formed which is then etched back. Thus, a structure as shown in FIG. 13(b) is obtained. Then, it is flattened by polishing to obtain a flattened structure as shown in FIG. 13(c). However, in this method, if a patterning for the block resist is displaced to form a resist out of the recess as shown by reference numeral 31' in FIG. 13(d), no sufficient flatness can be obtained even if a resist coating film 3' is formed, so that the burying material 5 does not become flat as shown in FIG. 13(e) and, as a result, it is difficult to flatten by means of polishing.

In addition, there is also the following problem. That is, the flattening technique by polishing involves a problem that the extent of polishing depends on the underlying pattern and sometimes it results in unevenness. Description will now be made to the problem with reference to FIG. 14.

In FIG. 14, trenches 41–43 are formed as recesses between each of protrusion patterns 61–64. The protrusion patterns 61–64 function as a stopper during polishing. As shown in FIG. 14, the density of the protrusion pattern 61 is small or sparse in the portion A of the figure in which the protrusion pattern 61 is present. In the portion B shown in the figure in which the protrusion patterns 62–64 are present, a ratio of the protrusion patterns per unit area (the area ratio of the protrusion patterns) is great and, accordingly, the density of the protrusion pattern is large or dense. In the illustrated embodiment, since silicon nitride or the like is used as a polishing stopper layer and is formed on the protrusion patterns 61–64, the area of the stopper layer 3 per unit area is small and, accordingly, the density thereof is sparse in the illustrated portion A. On the other hand, since the area of the stopper layer 3 per unit area is large, the density of the polishing stopper 3 is dense in the illustrated portion B shown in the figure. If there is unevenness of the ratio of the polishing stopper layer 3 (which exists for each of the protrusion patterns 61–64), polishing tends to become uneven.

For instance, in a peripheral circuit, if the area ratio per unit area of a protrusion pattern present at the periphery that functions as a polishing stopper layer is low (for example, in a case of the region A in FIG. 14), since polishing pressure is concentrated during polishing on the protrusion pattern (stopper layer), the polishing rate is increased, so that mere selection of the ratio of the protrusion pattern (stopper layer) is unsufficient and the isolation pattern 61 is worn off as shown in FIG. 14(b) so that it no longer has its intended effect as the stopper layer. As a result, the region A is concaved and a uniform and satisfactory flattening can not be attained as shown in FIG. 14(b).

Accordingly, there is a demand for a technique capable of attaining satisfactory flattening by polishing also in a case where the distribution of the polishing stopper layer shows unevenness (for instance, in a case where there is an unevenness for the density of protrusion patterns and, accordingly, there is an unevenness in the ratio of the polishing stopper layer) and also for a portion in which the area ratio is low, that is, a portion of a circuit pattern in which the portion that functions as the polishing stopper is sparse.

OBJECTS OF THE INVENTION

It is an object of the present invention to overcome the foregoing problems in the prior art and provide a means capable of flattening without leaving burying material on a wide (long) protrusion region which is thereby capable of forming trench isolation of a satisfactory flatness, as well as a method of manufacturing a semiconductor device formed with such trench isolation.

Another object of the present invention is to provide a method of manufacturing a semiconductor device having a polishing step of performing flattening after a burying step, wherein a satisfactory flattened shape can be formed even in a case where a distribution of a portion which is to serve as a polishing stopper on a portion to be polished has unevenness, also in a portion in which an area ratio of the stopper layer per unit area is low.

SUMMARY OF THE INVENTION

The foregoing objects are attained by the present invention, concerning a method of forming trench isolation including a burying step of burying trenches by a deposition means for conducting etching and deposition simultaneously and a polishing step of flattening a burying material by polishing, wherein the method comprises at least an isotropic etching step for isotropically etching the burying material before the polishing step.

The foregoing objects are attained by the present invention, concerning a method of forming trench isolation, wherein trenches are formed in a structure which has an etching stopper layer comprising a three-layered structure, and in which the upper layer of the etching stopper layer comprises a film having a polishing rate slower than that of the burying material and an etching rate also slower than that of the burying material, an intermediate layer of the etching stopper layer comprises a film having an etching rate slower than that of the upper layer, and a lower layer of the etching stopper layer comprises a film having an etching rate slower than that of the intermediate layer and faster than that of the substrate.

The foregoing objects are attained by the present invention, concerning a method of manufacturing a semiconductor device of forming trench isolation by using the method of forming trench isolation.

The foregoing objects are attained by the present invention, concerning a method of manufacturing a semiconductor device for forming trench isolation, which comprises a burying step of burying trenches by a bias ECR-CVD process, an isotropic etching step of isotropically etching a burying material thereby etching the burying material on a wide protrusion region and a polishing step of flattening the burying material by polishing.

The foregoing objects are attained by the present invention, concerning a method of manufacturing a semiconductor device for forming trench isolation by forming trenches in a structure, in which a substrate to form trench isolation has an etching stopper layer comprising a three-layered structure, in which the upper layer of the etching stopper layer comprises a silicon nitride, an intermediate layer of the etching stopper layer comprises polysilicon and a lower layer of the etching stopper layer comprises a silicon dioxide film.

The foregoing objects are attained by the present invention, concerning a method of manufacturing a semiconductor device having a polishing step including a step of burying recesses defined with a plurality of protrusion patterns by a burying material and a polishing step of flattening the burying material formed on the protrusion patterns by polishing, which comprises previously forming a pattern that constitutes a stopper layer for polishing and that is not intended to directly function as a wiring or insulation portion, to a portion in which the density of the stopper layer for polishing is sparse.

The foregoing objects are attained by the present invention, concerning a method of manufacturing a semiconductor device having a polishing step, wherein the pattern, which comprises a previously formed a pattern that constitutes a stopper layer for polishing and that is not intended to directly function as a wiring or insulation portion is finally removed by polishing. The foregoing objects are attained by the present invention, concerning a method of manufacturing a semiconductor device having a polishing step including a step of burying recesses defined with a plurality of protrusion patterns with a burying material on a semiconductor substrate having the plurality of protrusion patterns comprising a wide protrusion region and narrow protrusion region, and a step of flattening the burying material formed on the protrusion patterns by polishing, wherein the method comprises a step of previously forming a pattern that constitutes a stopper layer for polishing and that is finally removed on a portion in which the density of the stopper layer for polishing is sparse, and a step of at least partially etching the burying material on the wide protrusion region prior to the flattening step by polishing.

The foregoing objects are attained by the present invention, concerning a method of manufacturing a semiconductor device in which a plurality of protrusion patterns are formed on a substrate and trenches comprising recesses defined therebetween are buried, wherein a pattern as a stopper layer for polishing is previously formed on a portion in which the density of the protrusion patterns formed with the stopper layer for polishing is sparse to obtain a structure having the protrusions being uniformly distributed, thereby making the area ratio of the stopper layer uniform, subsequently, burying material is deposited and then the burying material on the protrusion patterns and the previously formed patterns are removed by polishing to obtain a flattened structure.

The foregoing objects are attained by the present invention, concerning a method of manufacturing a semiconductor device, wherein the burying material Is silicon dioxide and the layer which serves as the polishing stopper comprises silicon nitride.

The foregoing objects are attained by the present invention, concerning a method of manufacturing a semiconductor device, wherein the burying material is silicon dioxide and a bias ECR-CVD process is used for the formation of the burying material.

The foregoing objects are attained by the present invention, concerning a method of manufacturing a semiconductor device, wherein the burying material is silicon dioxide and an atmosphere pressure CVD process is used for the formation of the burying material.

The foregoing objects are attained by the present invention, concerning a method of manufacturing a semiconductor device, wherein CVD silicon dioxide is formed by using an organic silicon gas. The foregoing objects are attained by the present invention, concerning a method of manufacturing a semiconductor device, wherein the layer constituting the polishing stopper comprises silicon nitride and a step of at least partially removing the burying material on the wide protrusion region prior to the flattening step by polishing utilizes a means of applying isotropic etching while masking other positions than the etched portion with a resist.

The foregoing objects are attained by the present invention, concerning a method of manufacturing a semiconductor device including a burying step in which a recess burying material is deposited by a deposition means on a substrate formed with a plurality of recesses and a polishing step in which the burying material is flattened by polishing, wherein the method comprises a resist depositing step of depositing a resist on the substrate after the polishing step, a resist pattern forming step of forming a resist pattern while exposing the burying material remaining in the portions other than the recesses to be buried, and a removing step of removing the burying material remaining on the portions other than in the recesses to be buried by using the resist pattern as a mask.

The foregoing objects are attained by the present invention, concerning a method of manufacturing a semiconductor device including a burying step for depositing a recess burying material by a deposition means on a substrate formed with a plurality of recesses and a polishing step of flattening the burying material by polishing, wherein the method comprises a flattened layer forming step of forming a flattened layer on the substrate, and an etching back step for etching back given that the etching rate is equal between the flattened layer and the burying material.

The foregoing objects are attained by the present invention, concerning a method of manufacturing a semiconductor device which comprises burying silicon dioxide as the burying material into a plurality of recesses on a substrate having a silicon nitride film to serve as a stopper layer during polishing by a base CR-CVD process and then conducting a polishing step for flattening the burying material by polishing, conducting a resist forming step of forming a resist on a substrate after the polishing step and a resist pattern forming step of forming a resist pattern while exposing the burying material remaining on the portions other than in the recesses to be buried as the burying material not removed completely and, subsequently, conducting a removing step of removing the burying material remaining on the portion other than in the recesses to be buried by using the resist pattern as a mask, thereby conducting burying and flattening with the residue of the burying material removed completely.

The foregoing objects are attained by the present invention, concerning a method of manufacturing a semiconductor device which comprises a burying step of forming a recess burying material by depositing silicon dioxide by a bias ECR-CVD process on a substrate in which a plurality of recesses are formed and on which a silicon nitride film is formed as a stopper layer during polishing, a polishing step of flattening the burying material by polishing, a flattened layer forming step of forming a flattened layer on a substrate by a resist or SOG and an etching back step of etching back given that the etching rates are equal between the flattened layer and the burying material.

The foregoing objects are attained by the present invention, concerning a method of manufacturing a semiconductor device having a polishing step including a step of forming a plurality of protrusion patterns each having a stopper layer for polishing in the upper portion, a step of burying recesses defined with a plurality of protrusion patterns by a burying material and a step of flattening the burying material formed on the protrusion patterns by polishing, wherein the method comprises forming a second polishing stopper layer at least on the recess burying material after burying the recesses.

The foregoing objects are attained by the present invention, concerning a method of manufacturing a semiconductor device including a step of forming a plurality of protrusion patterns each having a stopper layer for polishing in the upper portion, a step of burying a plurality of recesses comprising wide recesses and narrow recesses defined with a plurality of protrusion patterns by a burying material and a step of flattening the burying material formed on the protrusion patterns by polishing, wherein the method comprises forming a second stopper layer for polishing at least on the entire surface of the recess burying material after burying the recesses.

The foregoing objects are attained by the present invention, concerning a method of manufacturing a semiconductor device which comprises forming a plurality of protrusion patterns on a substrate having a silicon nitride layer as a stopper layer for polishing and a poly-Si layer as an etching stopper layer of the silicon nitride layer in the upper portion, forming silicon dioxide as a burying material in recesses defined with a plurality of protrusion patterns by a CVD process, burying the recesses, subsequently, forming a second stopper layer for polishing over the entire surface, leaving a second stopper layer for polishing only on the burying material in a wide recess in a portion in which the density of the stopper layer for polishing is sparse by an etching step using a resist, and, thereafter, flattening the burying material formed on the recesses by polishing.

The foregoing objects are attained by the present invention, concerning a method of manufacturing a semiconductor device, where silicon dioxide as the burying material is formed by a $O_3$-TEOS CVD process.

The foregoing objects are attained by the present invention, concerning a method of manufacturing a semiconductor device, wherein the burying material and the stopper layer for polishing are formed by a CVD process.

The foregoing objects are attained by the present invention, concerning a method of manufacturing a semiconductor device, wherein the burying material and the stopper layer for polishing are formed by a deposition means for applying etching and deposition simultaneously.

The foregoing objects are attained by the present invention, concerning a method of manufacturing a semiconductor device, wherein the deposition means for applying etching and deposition simultaneously is a bias ECR-CVD process.

The foregoing objects are attained by the present invention, concerning a method of manufacturing a semiconductor device, wherein the second stopper layer for polishing is formed over the entire surface of the recesses that constitute trenches.

According to the present invention, most of the material to be polished on the wide (long) protrusion region is removed in the etching step prior to the polishing step and, since all of the remaining portions to be polished are in a protruding shape, the polishing rate therefor is faster than that for the flattened surface to facilitate flattening. This enables flattening of formations that provide isolation.

For instance, the upper layer of the etching stopper layer functions as an etching stopper during etching of the burying material and, further, the intermediate layer 22 functions as a stopper for the upper layer 23 (refer to FIG. 2) and the lower layer functions as an etching stopper to the intermediate layer 22 and, accordingly, etching of the burying material can be performed till the surface of the stopper layer is exposed and, further, the burying material remaining on the protrusion region can be removed completely without requiring an etching back step.

Further, according to the present invention, a semiconductor device having satisfactorily flattened trench isolation can be obtained. Further, according to the present invention, a pattern that functions as a stopper layer for polishing and that is not intended directly to function as a wiring or insulation portion (which hereinafter is sometimes referred to as a dummy pattern)is formed, for example, on a portion in which the density of the protrusion pattern that serves as a polishing stopper is sparse, previously before polishing, for example, before deposition of the burying material by CVD or the like, so that the effect of the stopper layer can be made nearly uniform over the entire surface of the portion to be polished, the dummy pattern is preferably formed such that the area ratio of the stopper layer is greater than a predetermined ratio and then the polishing step is performed. Accordingly, a satisfactorily flattened shape can be formed.

Therefore, according to the present invention, it is possible to form a satisfactory flattened shape even in a case where the area ratio of the polishing stopper layer per unit area in the portion to be polished is low.

Further, according to the present invention, the material to be polished on the wide (long) protrusion region, if it remains after polishing, can easily be removed by a removed step using a resist pattern as a mask to conduct flattening, by which It is possible to manufacture a semiconductor device in which flat burying is attained.

Further, according to the present invention, the material to be polished on the wide (long) protrusion region, if it remains after polishing, can be easily removed by the etching back step to achieve flattening. This enables the manufacture a semiconductor device having flat burying of trenches.

Further, according to the present invention, after burying the recesses and depositing the burying material, for example, by CVD, the second polishing stopper layer is formed at least on the recess burying material, for example, on the recess burying material in a portion where the density of the polishing stopper layer is sparse, by which the stopper function can be made nearly uniform over the entire surface of the portion to be polished, the area ratio of the stopper layer can be increased preferably to greater than a predetermined ratio and, thereafter, polishing is performed. Consequently, a uniform and satisfactorily flattened shape can be obtained.

Therefore, according to the present invention, it is possible to form a satisfactorily flattened shape even in a case where the area ratio of the polishing stopper layer per unit area of the polished portion is low. Further, according to the present invention, after burying the recesses, for example, after depositing the burying material by CVD or the like, a second polishing stopper layer is formed at least over the entire surface of the recess burying material, so that the stopper function can be made nearly uniform over the entire surface of the polished portion and the area ratio of the stopper can be increased, preferably, to greater than a predetermined ratio and, subsequently, polishing is performed. Accordingly, a uniform and satisfactorily flattened shape is obtained.

Therefore, according to the present invention, a satisfactorily flattened shape can be formed even in a case where the area ratio of the polishing stopper layer per unit area of the polished portion is low.

DETAILED DESCRIPTION OF THE PREFERRED EMBODIMENTS EXAMPLES

Descriptions will now be made to preferred embodiments according to the present invention with reference to the drawings.

It will be apparent that the present invention is not restricted to the following example.

EXAMPLE 1

In this example, the present invention is applied to the formation of an integrated a semiconductor device and, in particular, to the formation of trench isolation in the semiconductor device.

Figure 1A:
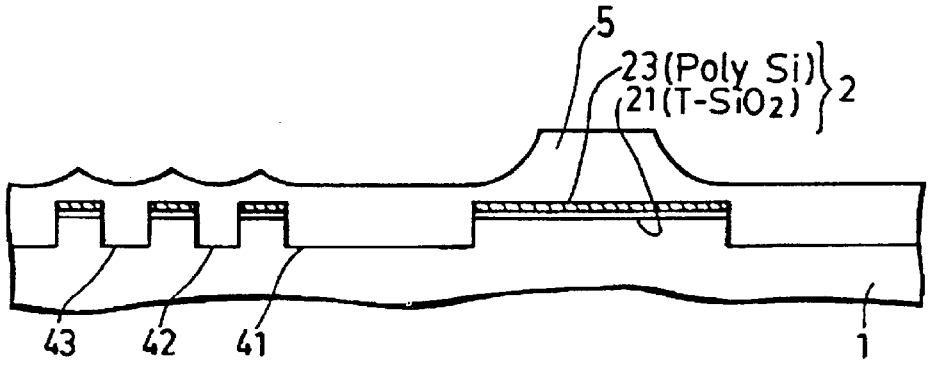
FIG. 1(a)–(f) shows steps in Example 1.
Figure 1B:
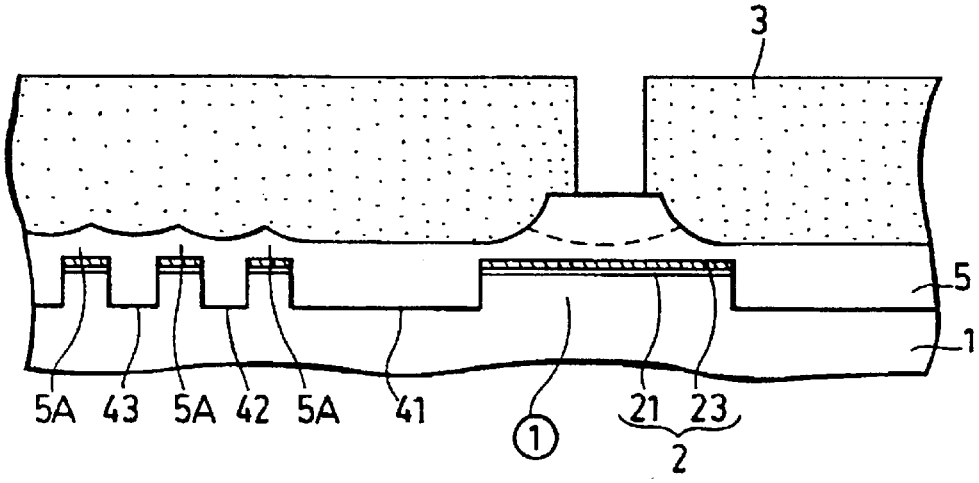
Figure 1C:
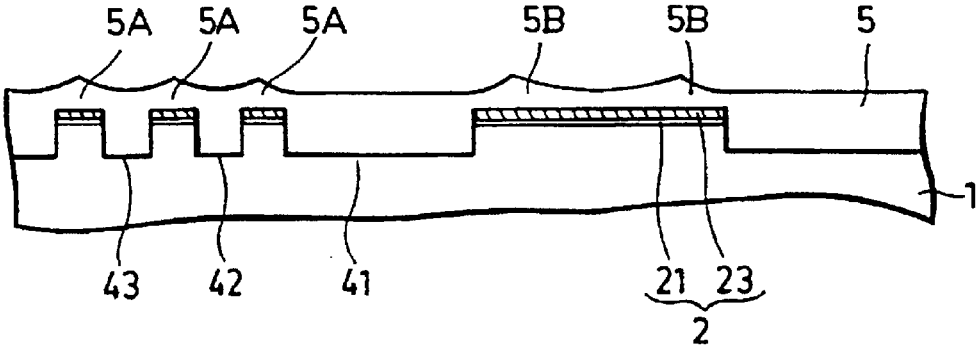
Figure 1D:
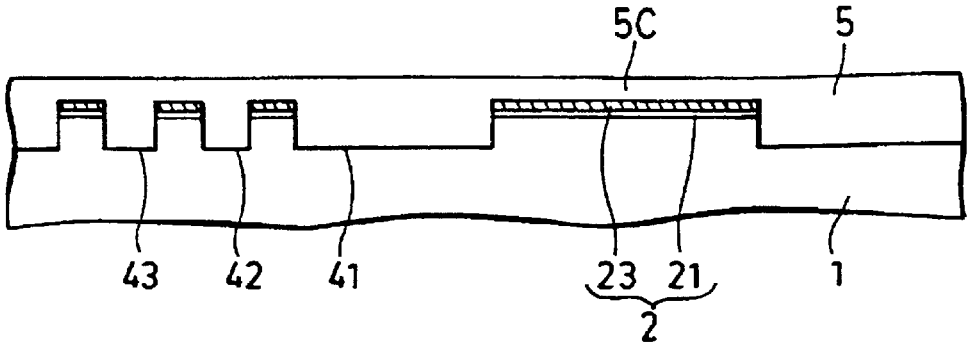

In this example, a structure as shown in FIG. 1(a) is obtained by burying trenches 41–43 by a deposition means that conducts etching and deposition simultaneously (a bias ECR-CVD process is used in this example). Then, an isotropic etching step for isotropically etching the burying material as shown by a broken line in FIG. 1(b) is performed to obtain a structure as shown in FIG. 1(c) before the polishing step. Subsequently, a flat structure as shown in FIG. 1(d) is obtained after the polishing step.

The burying material 5 on a wide protrusion region is etched by the isotropic etching step in FIG. 1(b) into a shape substantially uniform with other portions as shown in FIG. 1(c). Accordingly, a satisfactory flattening is attained by polishing the remaining protruding portions.

More specifically, this example is set forth in the following steps (1)–(6).

(1) A lower layer 21 which is a thermally oxidized film (T-$SiO_2$) and an upper layer 23 which is a poly Si film are formed to a substrate 1 (a silicon substrate in this example) to constitute a stopper layer 2. Further, trenches 41–43 are formed and a layer of the burying material 5 is formed in the Si trenches by forming a $SiO_2$ film to a thickness greater than the depth of the trench by an ECR-CVD process. Thus, a structure as shown in FIG. 1(a) is obtained. CVD conditions in this case may be set, for example, as:
microwave= 1000 W, RF= 500 W, $SiH_4/H_2O$ 21/35 sccm, magnetic field= gauss and pressure $7\times10^{-4}$ torr.

(2) As shown in FIG. 1(b), resist 3 is patterned so as to remain in other portions that a wide (long) protrusion region (1).

(3) $SiO_2$ which is the burying material 5 is isotropically etched by isotropic etching. For instance, this may be performed by wet etching using a solution of hydrofluoric acid diluted to 1/40. In this case, it is not necessary to completely remove $SiO_2$ above the upper layer 23 (poly-Si) but it may be left as it is. That is, it may suffice to etch to the same film thickness as that of the narrow protrusions. The protruding shape of the portion is shown by 5B. Subsequently, the resist 31 is removed to obtain a structure shown in FIG. 1(c).

Figure 3:
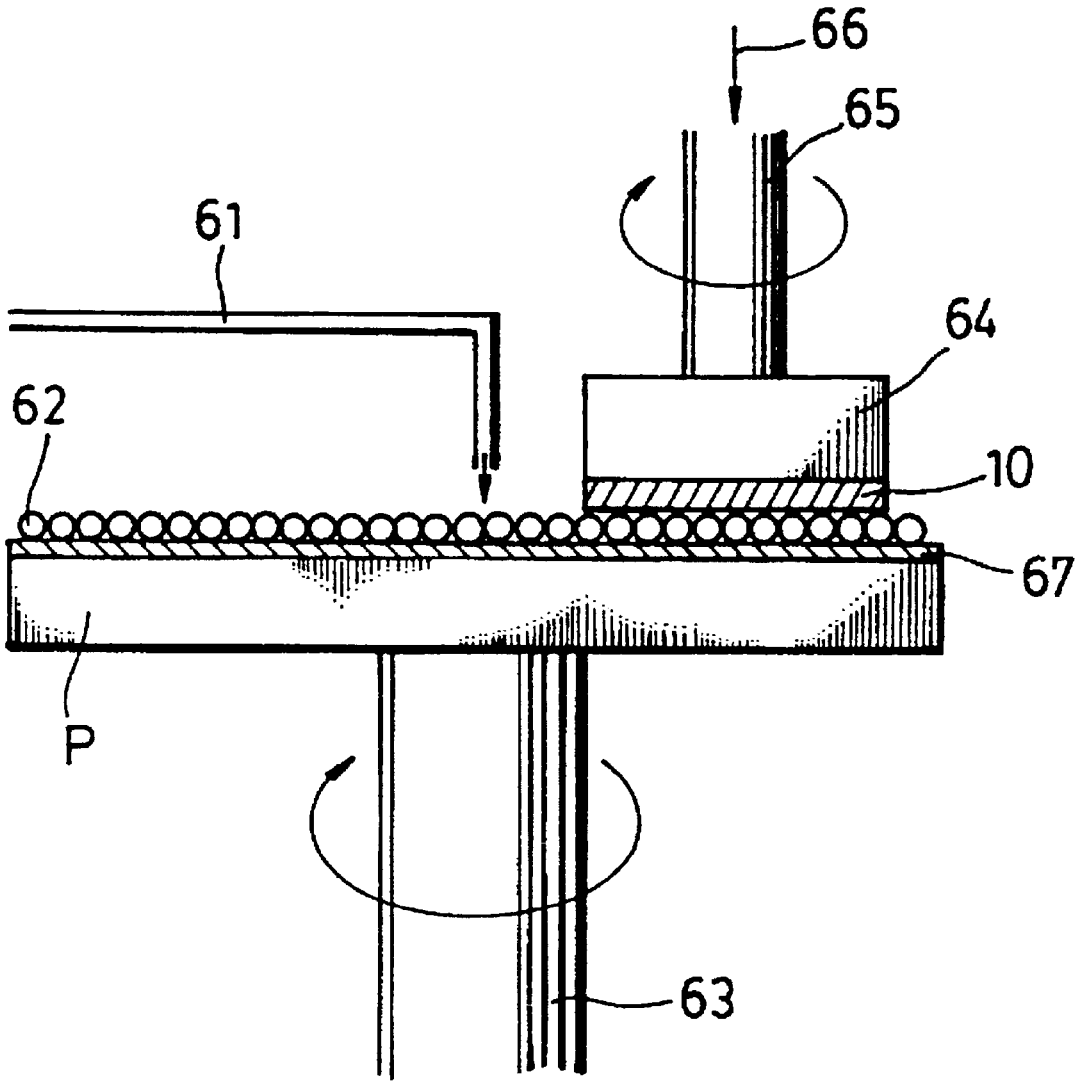
FIG. 3 shows a polisher device used in each of the examples.

(4) Polishing is performed by using a polisher. A device as shown in FIG. 3 can be used as a polisher. The polishing conditions in this case may be set as: speed of rotation of a polishing plate P= 37 rpm, speed of rotation of a wafer holder specimen table 64=17 rpm, polishing pressure (shown by arrow 66 in FIG. 3)= 8 psi, slurry introduction rate from a slurry introduction pipe 61= 255 ml/min and temperature of a pad 67=40° C. As a slurry (shown schematically as 62 in FIG. 3), a mixture of silica, KOH and water can be used. For instance, as a polishing solution (slurry) used for polishing. SC-1 (a name of a product manufactured by Cabot Corporation) can be used. The solid ingredient is silica (30% based on the entire weight) (pH: 10.5–10.7, silica grain size: 25–35 mm, pH controller: KOH). The SC-1 is diluted to 15–20 times with deionized water and it is used under pH control by a solution of diluted hydrochloric acid or KOH and NaOH. In FIG. 3 are shown a rotational shaft 63 for the polishing plate P, a rotational shaft 65 for the wafer holder specimen table 64 that supports a wafer as a substrate 10 to be polished.

Upon polishing, only the protrusion portions 5A, 5B formed by the isotropic etching step as described in (3) above may be polished. Since the protruding shape shows a higher polishing rate than a rounded shape and etching only for the protrusion portion can be conducted in a short period of time even if uniformity within the plane of polishing is poor, uniformity within the plane of a wafer can be maintained. Further, the shape of the $SiO_2$ protrusion 5A as the burying material 5 over the narrow protrusion region can be formed only by the bias ECR-CVD capable of conducting sputter etching and CVD simultaneously but such protruding shape can not be formed by a conformal CVD. Accordingly, it may be polished in the shape as it is formed into a film. Thus, a structure as shown in FIG. 1(d) can be obtained.

Figure 1E:
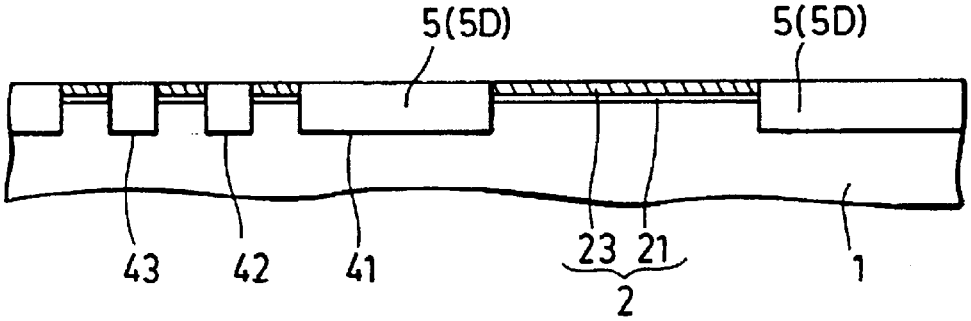
Figure 1F:
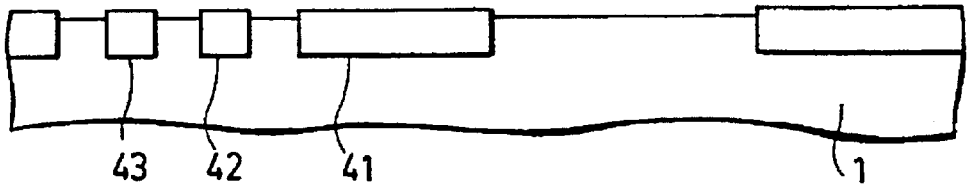

(5) Then, $SiO_2$ as the burying material 5 is etched back till the poly-Si surface as the upper layer 23 is exposed. It can be conducted, for instance, by using a magnetron RIE under the conditions as: $C_4F_8$=50 sccm, RF= 1200 W and pressure=2 Pa. Thus, a structure as shown in FIG. 1(e) can be obtained.

(6) Subsequently, poly-Si of the upper layer 23 and T-$SiO_2$ of the lower layer 21 formed as the etching stopper of poly-Si may be eliminated.

EXAMPLE 2

Descriptions will be made to Example 2 which includes formation of trench isolation and manufacture of a semiconductor device.

Figure 2A:
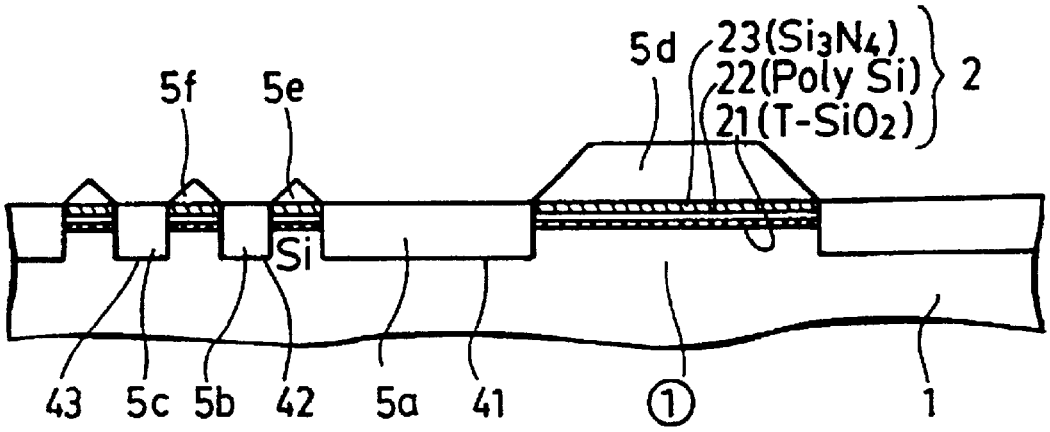
FIG. 2(a)–(e) shows steps in Example 2.
Figure 2B:
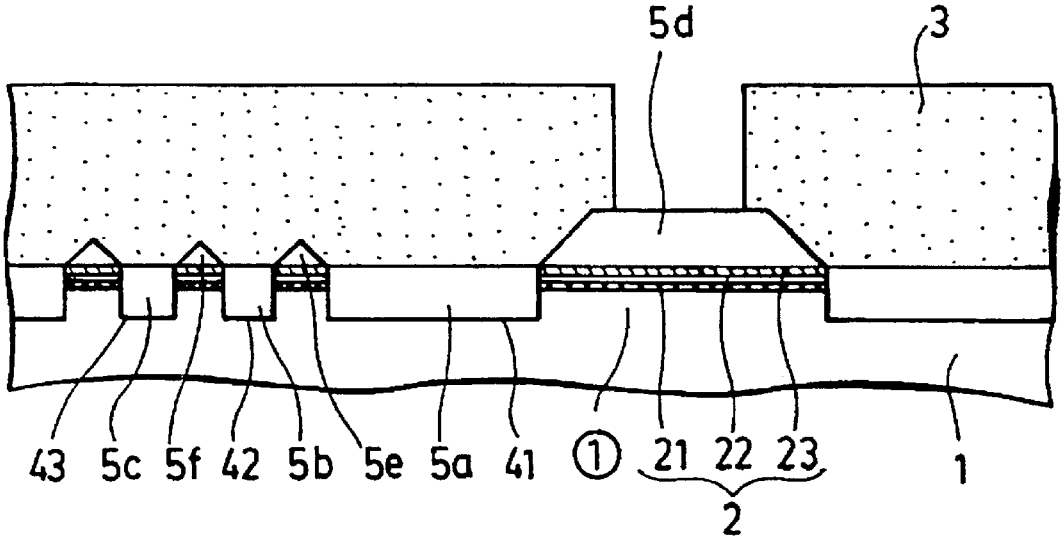
Figure 2C:
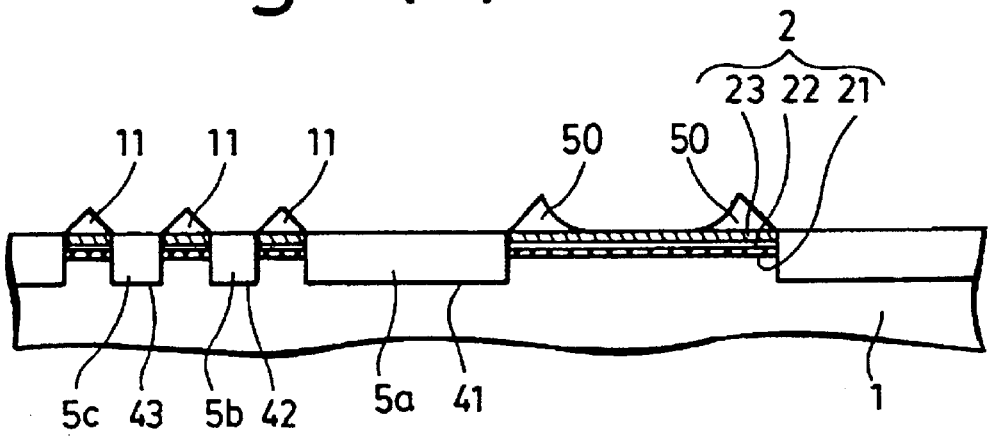
Figure 2D:
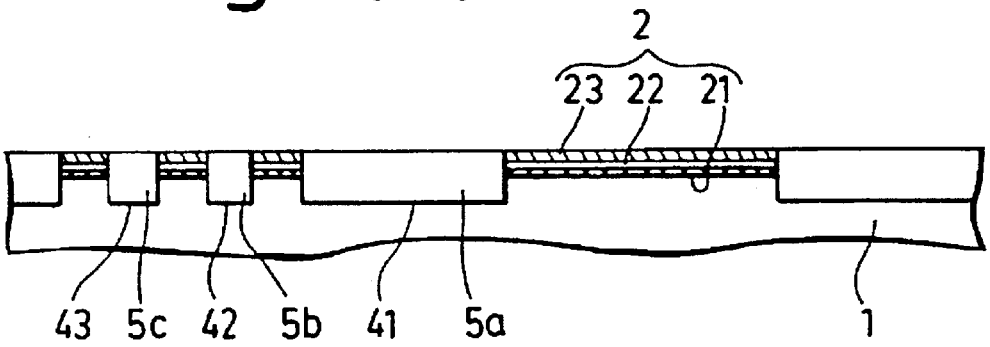
Figure 2E:
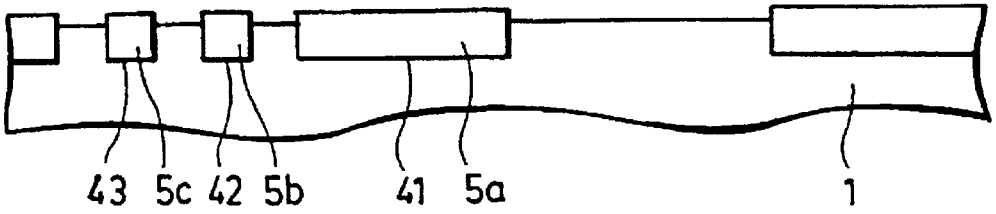

In Example 1, when the burying material is etched back as far as the upper portion of the trench opening in the state shown in FIG. 2(d), that is, when it is to be etched back by the thickness of the burying material on the protrusion region shown by 5C in FIG. 2(d), since the and point can not be judged, it is difficult to control the etching film thickness as the burying material 5 for the isolation portion shown in FIG. 2(e). Example 2 undertakes to overcome the problem.

In Example 2, since $SiO_2$ which is the burying material after resist patterning can be etched as far as the surface of the support layer is exposed and the burying material ($SiO_2$) on the protrusion region can be removed completely by polishing in the next step, etching back which is necessary in Example 1 is no longer required.

In this example, a substrate 1 to be formed with trench isolation has an etching stopper layer 2 comprising a three-layered structure as shown in FIGS. 2(a), (b), (c), (d), trench isolation is formed in a structure in which the upper layer 23 (a silicon nitride film in this example) of an etching stopper layer 2 is formed with a film having a polishing rate slower than that of the burying material 5 and an etching rate also slower than that of a burying material 5, an intermediate layer 22 (a polysilicon film in this example) Is formed with a film having an etching rate slower than that of the upper layer 23, and a lower layer 21 (thermally oxidized silicon dioxide in this example) is formed with a film having an etching rate smaller than that of the intermediate layer 22 and an etching rate faster than that of the substrate. More specifically, this example is set forth in the following steps (1)–(6).

(1) A structure to be formed with trench isolation is formed so as to have an etching stopper layer of a three-layered structure, in which the uppermost layer 23 is, for example, of $Si_3N_4$ as the material for the polishing stopper layer when $SiO_2$ is the burying material 5, the intermediate layer 22 is, for example, of polysilicon as the material of an etching stopper for the upper layer 23 ($Si_3N_4$) and the lower layer 21 is, for example, of $SiO_2$ as the material which has an etching rate slower than that of the intermediate layer 22 and an etching rate faster than that of Si which is the material of the underlying substrate 1, trenches 41–43 formed in this structure are buried to just the same depth as that of the trench by a bias ECR-CVD method as a deposition means capable of conducting etching and deposition simultaneously. The CVD conditions may be identical with those in Example 1. This can provide a structure as shown in FIG. 2(a). In the drawing, are shown a burying material 5a buried in a wide trench 41, burying materials 5b, 5c buried in narrow trenches 41–43, burying material 5 over a wide protrusion region (1) and burying materials 5e, 5f on a narrow protrusion region.

(2) Resist 3 is patterned on portions other than the wide (long) protrusion area (1). Thus, a structure as shown in FIG. 2(b) can be obtained.

Figure 4A:
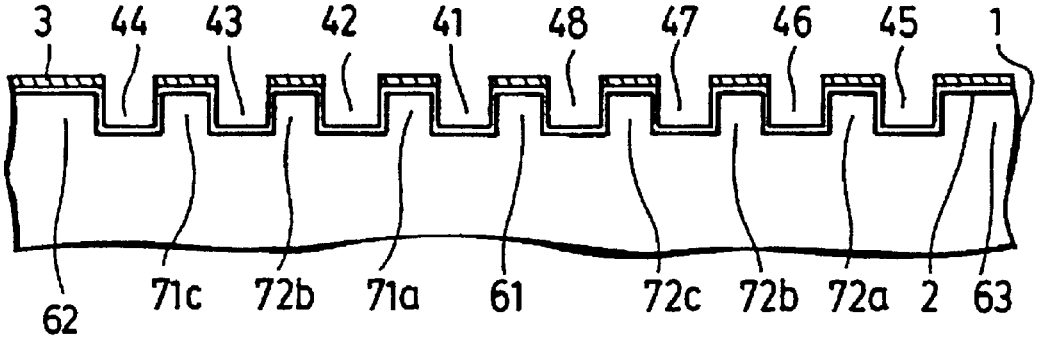
FIG. 4(a)–(c) shows steps in Example 5.

(3) Isotropic etching is conducted to etch the burying material 5d on the wide (long) protrusion region (1). For instance, wet etching may be conducted, for example, by using a solution prepared by diluting, for example, hydrofluoric acid to 1/40 concentration. The ratio of the etching rate between the CVD-$SiO_2$ as the burying material 5d and $Si_3N_4$ as the upper layer 23 to hydrofluroic acid is about 8:1. If over etching is conducted as far as the $Si_3N_4$ surface of the upper layer 23 is exposed, there is no problem at all, Subsequently, the resist is removed. Thus, a structure as shown in FIG. 4(c) is obtained.

(4) Portions 50 of a protruding shape formed by isotropic etching in the step (3) above are eliminated by polishing. In this case, since flattening can be attained by flattening on the protrusion portions 50, the polishing time is shorter.

Further, since the ratio of the polishing rate between $SiO_2$ as the burying material 5 and $Si_3N_4$ as the material for the upper layer 23 is about 5:1, $Si_3N_4$ functions sufficiently as the stopper layer. Thus, a structure as shown in FIG. 2(d)is formed.

(5) Then, $SiO_2$ as the burying material 5 is etched back until the $Si_3N_4$ surface of the upper layer 23 is exposed. This can be attained by using, for example, magnetron RIE and under the conditions of $C_4F_8$= 50 sccm, RF= 1200 W, pressure= 2 Pa. Thus, a structure as shown in FIG. 2(d) can be obtained.

(6) Then, the etching stopper layer 2 is removed. At first, $Si_3N_4$ as the upper layer 23 is removed by using for example, magnetron RIE and under the conditions as: $C_4F_8$=50 sccm, RF= 1200 W, pressure= 2 Pa. Further, $Si_3N_4$ may be removed by using hot phosphoric acid. Next, poly-Si as the intermediate layer 22 is removed, for example, with KOH, and T-$SiO_2$ as the underlying layer 21 is removed by means of hydrofluoric acid.

In this case, the poly-Si of the intermediate layer functions as a stopper to $Si_3N_4$ constituting the upper layer 23, while T-$SiO_2$ constituting the lower layer 21 functions as an etching stopper to the poly-Si of the intermediate layer 22.

EXAMPLES 3, 4

The following samples are modified from Examples 1–2 described above. While isotropic etching is applied by wet etching using an etching solution before the polishing of the burying material in Examples 1, 2, isotropic etching was conducted by means of dry etching in these examples.

In the examples, $SiO_2$ as the burying material 5 was isotropically dry etched under the following conditions, instead of etching by hydrofluoric acid as in Examples 1 and 2:

Etching apparatus used: parallel flat type ether

Pressure: 2300 mtorr (306 Pa)

RF power: 550 W

Gas system used: $NF_3$= 300 cc/min He= 200 cc/min

Temperature: 80° C.

Satisfactory isotropic etching could be attained by the conditions described above. The conditions were set in order to increase the power of the conducing reaction using fluoric acid radicals as a main etchant and increase the pressure for reducing the directionality of ions (to shorten the mean free path), thereby attaining isotropic etching.

Other procedures were the same as those in Examples 1 and 2. Also in these examples, satisfactory trench isolation was formed and highly reliable semiconductor devices are obtained in the same manner as in Examples 1 and

EXAMPLE 5

In this example, the present invention is applied to a method of manufacturing a fine and integrated semiconductor device to be formed with trench isolation. FIG. 3 shows the steps of this example.

In this example, a plurality of protrusion patterns 61–63 were formed on a substrate 1 and trenches formed between each of the protrusions were buried. For a portion in which the density of the protrusion patterns 61–63 to which the polishing stopper layer 3 was formed (illustrated portion) was thin, dummy patterns 71a–71c and 72a–72c constituting the polishing stopper layer were previously formed to provide a structure as shown in FIG. [3(a)] *6(a)* in which protrusions were uniformly distributed, i.e., the ratio of the surface of the stopper layer 3 present was made uniform. Subsequently, a burying material 5 was deposited to obtain a structure as shown in FIG. 6(b) and then the burying material 51 on the protrusion patterns 61–63 and, particularly, formed patterns 71a 71c, 72a 72c (hereinafter referred to sometimes as "dummy patterns") were removed by polishing to obtain a flattened structure as shown in FIG. [3(c)] *6(c)*.

Specifically, in this example, flattened trench isolation was formed by the following steps (1)–(3).

(1) As shown in FIG. [3(a)] *6(a)*, after forming a thermally oxidized film as a silicon oxide layer 2 and a $Si_3N_4$ layer as a polishing stopper layer 3 on a semiconductor substrate 1, for example, of silicon, protrusion patterns 61–63 actually used as circuit patterns, etc. and dummy patterns 71a–71c, 72a–72c were formed simultaneously by an etching step using a resist process so that the area ratio of the stopper layer 3 per unit area is greater than a predetermined ratio irrespective of the locations on the semiconductor wafer.

As the etching conditions in this example, the following conditions were used for instance:

Gas system used: $C_2Cl_3F_3/SF_8$= 60/10 (sccm)

Microwave power: 850 (W)

RF power: 150 (W)

Pressure: 1.33 (Pa)

(2) Then, the trenches 41–48 were buried by a CVD process. Thus, a structure as shown in FIG. [3(b)] *6(b)* was obtained. In this example, burying was conducted by depositing a silicon oxide film by a bias ECR-CVD process having a high burying performance and capable of providing a satisfactory buried flattened shape (since etching and deposition were conducted simultaneously in this method, it was satisfactory as the burying flattening technique). As the bias ECR-CVD conditions, the following conditions were used for instance.

Gas system used: $SiN_4/N_2O$=20/35 (sccm)

Microwave power: 1000 (W)

RF power: 500 (W)

Magnetic flux density: $8.75\times10^{-2}$ (T)

Pressure: $9.3\times10^{-2}$ (Pa)

(3) Then, excess burying material 51 ($SiO_2$) on the protrusion patterns 61–63 and the dummy patterns 71a–71c, 72a–72c were removed by a polishing process. Thus, a structure as shown in FIG. [3(c)] *6(c)* was obtained. As a polishing device in this example, a customary device as shown in FIG. 3 was used. The polishing was conducted under the conditions, for example, as shown below.

Speed of rotation of a polishing plate: 37 (rpm)

Speed of rotation of a wafer holder specimen table: 17 (rpm)

Polishing pressure: $5.5\times10^3$ (Pa)

Slurry flow rate: 225 (ml/min)

Pad temperature: 40 (° C.)

Slurry: silica (0.025–0.035 rpm)

KOH (pH<10.5)

Water

In FIG. 3, are shown a polishing plate P, a slurry introduction pipe 81, a slurry 82, a rotational shaft 83 for the polishing plate, a wafer holder specimen table 84, a rotational shaft 85 for the wafer holder specimen table, a pressure 86 adjusted upon polishing, a polishing pad 87 and a wafer 10 as a material to be polished.

In the polishing step, the selection ratio between the stopper layer ($Si_3N_4$) and the burying material 5 ($SiO_2$) was an $SiO_2/Si_3N_4$=4/6, and the area ratio of the stopper layer per unit area was increased by the provision of the dummy patterns 71a–71c, 72a–72c even in the periphery of the isolation pattern 61 in which the distribution of the protrusion patterns was thin, so that excess polishing for the isolation pattern 61 caused by over polishing could be prevented, to attain a satisfactory flattened surface.

EXAMPLE 6

Figure 4B:
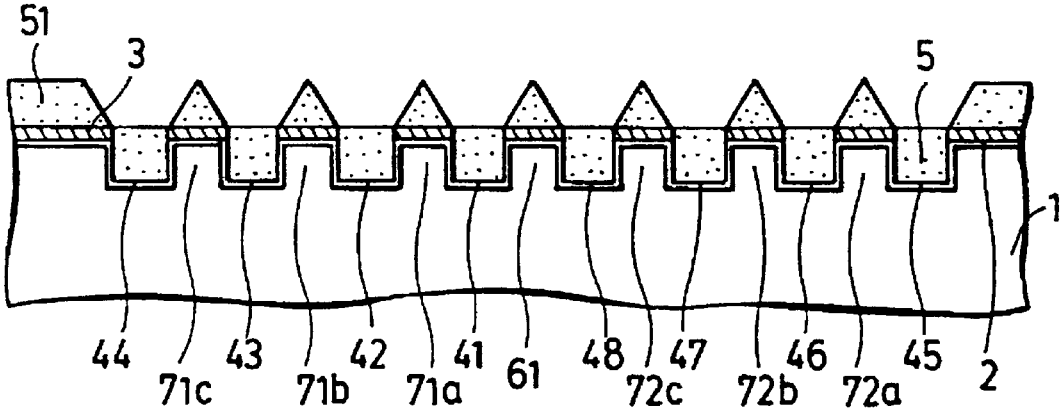
Figure 4C:
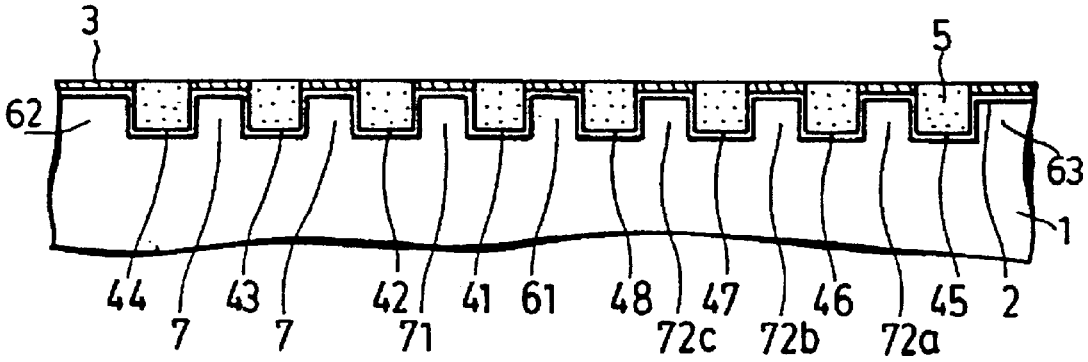

In this example, the present invention was applied to the formation of trench isolation as shown in FIG. 4. While the bias ECR-CVD process was used in Example 1 for forming the burying oxide film, an atmospheric CVD process capable of forming an insulation film was used in this example. Description will be made in the order of the steps.

Figure 14A:
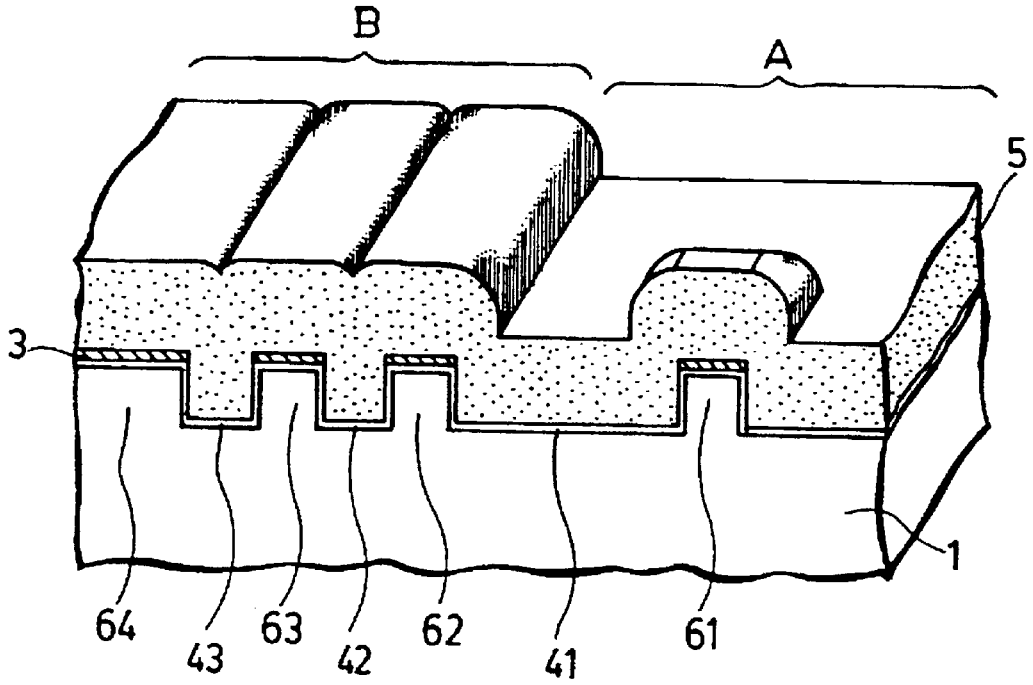
FIG. 14(a)–(b) shows problems in the prior art.
Figure 14B:
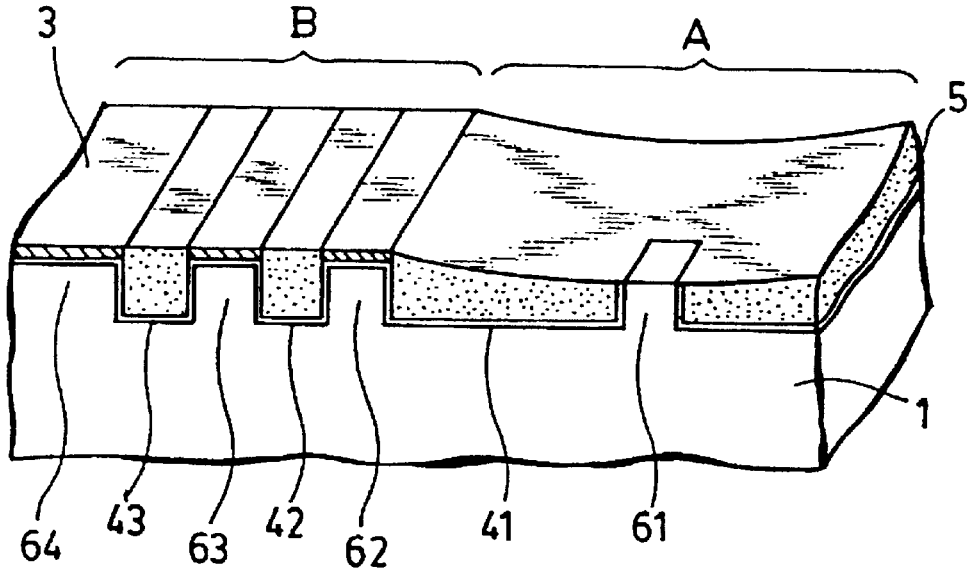

(1) In a silicon substrate 1 in which poly-Si as an etching stopper layer 8 and a silicon oxide layer 2 as an etching stopper layer for the stopper layer 8 (poly-Si) therebelow were formed, for instance, protrusion patterns 61–63 including actual patterns 61, as well as dummy patterns 71a–71c and 72a–72c to be removed subsequently were formed simultaneously by an etching process using a resist process such that the area ratio of the stopper layer per unit area was greater than a predetermined ratio irrespective of location on the wafer, in a portion corresponding to a wide recess trench 41 explained in FIG. 14 in the same manner as in Example 5. In this case, a microwave etching device was used and the process was carried out, for example, under the following conditions.

Gas system used: $C_2Cl_3F_3/SF_6$=60/10 (sccm)

Microwave power: 850 (W)

RF power: 150 (W)

Pressure: 1.33 (Pa)

Then, silicon oxide was formed through reaction, for example, between an organic silicon compound (for example, TEOS) and ozone as the burying material 5, which was buried to about the film thickness used to bury the trenches. Thus, a structure as shown in FIG. 4(a) was obtained. The process was conducted under the CVD conditions, for example, as shown below.

Gas system used: TEOS/$O_3$= 350/350 (sccm)

Growing temperature: 390 (° C.)

Pressure: $1.20\times10^4$ (Pa)

Figure 5A:
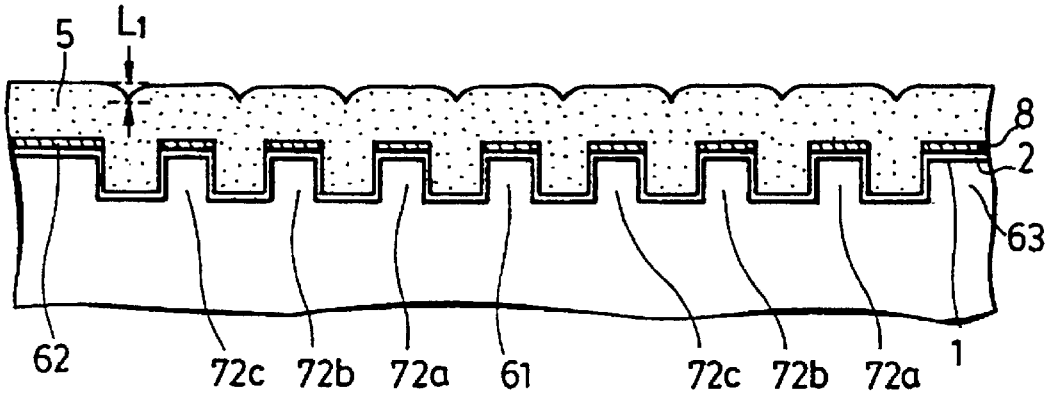
FIG. 5(a)–(d) shows steps in Example 6.

However, since a recessed amount ($L_1$) was present for the shape of the silicon oxide layer after it was buried in this step as shown in FIG. 5(a), the thickness of the remaining film in the trench recess after polishing was made smaller than the depth of the trench, thereby failing to obtain a satisfactory flattened shape.

Figure 5B:
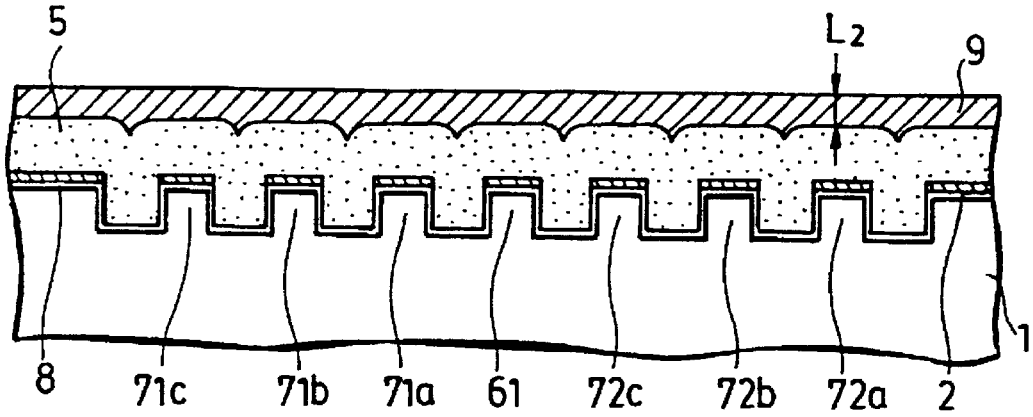

(2) Then, in this example, a coating film 9 was coated to such a film thickness as capable of absorbing the recessed amount ($L_1$) in the silicon oxide film as shown in FIG. 5(b). For instance, SOG (Spin On Glass) may be used for the formation of the coating film 9, for instance. The film thickness may be adjusted to ½–1 times as great as the trench depth. As the SOG coating conditions, the following conditions were employed, for instance.

Coating film: Type 7 manufactured by Tokyo Ohka Co.

Speed of rotation: 4000 (rpm)

Time: 60 (sec)

Baking temperature: 400 (° C.)

Baking time: 30 (min)

Figure 5C:
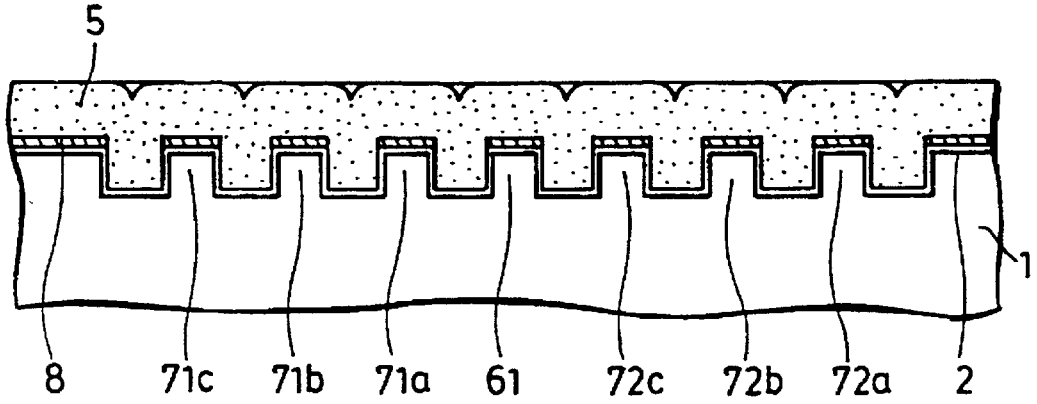

(3) Then, as shown in FIG. 5(c), a polishing step was performed until the

SOG film 9 on the trench protrusions was removed as shown in FIG. 5(c), i.e., by the film thickness $L_2$ of polishing was applied the SOG film 9. In this case, since the SOG film 9 had a greater polishing rate than that of the silicon oxide film which serves as the burying material 5, so that the silicon oxide film functions as a stopper layer for the SOG film 9.

Figure 5D:
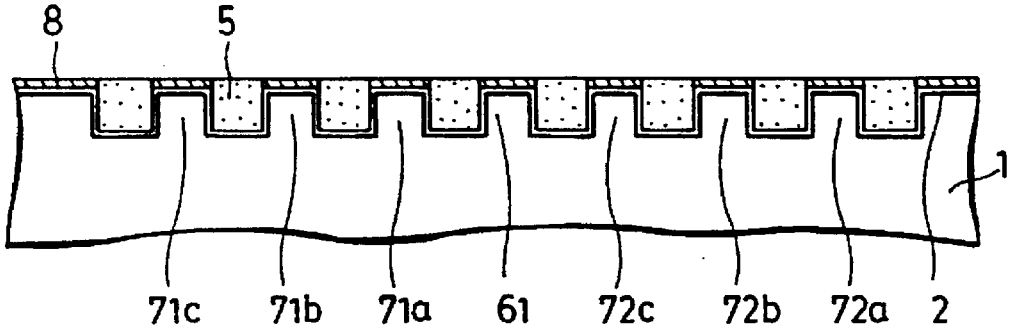

(4) Then, etching back was performed until the upper surface of the etching stopper layer 8 was exposed under the conditions that the etching selection ratio between the silicon oxide film as the burying material 5 and the SOG film 9 is at 1. Thus, a flattened structure as shown in FIG. 5(d) was obtained. As the conditions using RIE in this case, the following condition can be selected for instance.

Gas system use: $CHF_3/O_2$= 70/13 (sccm)

RF power: 1150 (W)

Pressure: 5.33 (Pa)

EXAMPLE 7

In this example, the present invention was applied to the formation of trench isolation as shown in FIG. 6. Further, as a method of removing an excess burying material 5 (a silicon oxide film), a silicon oxide film 51 present in a wide protrusion region was at least partially removed previously by etching using a resist process and, subsequently, a silicon oxide film 52 in a wide burying region including dummy patterns was removed by polishing. More specifically, it was practiced as set out below.

Figure 6A:
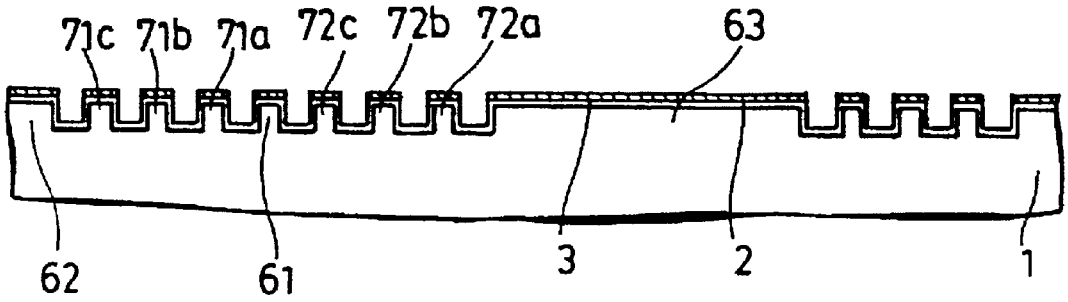
FIG. 6(a)–(e) shows steps in Example 7.
Figure 6B:
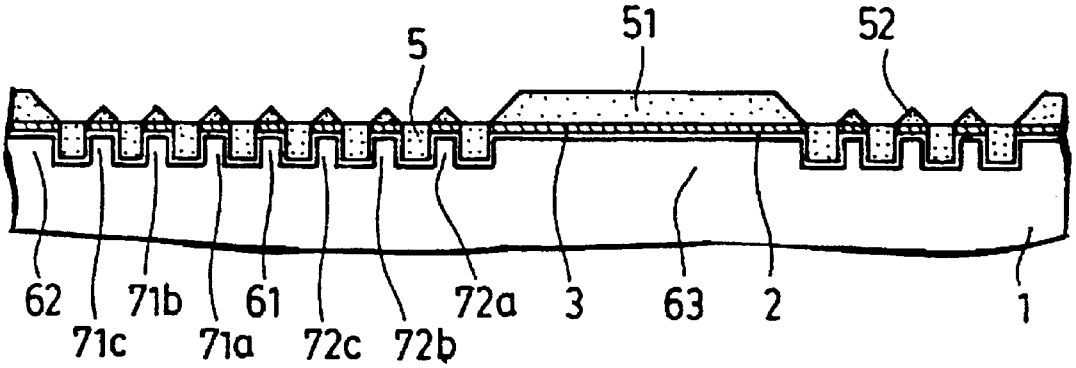

(1) As shown in FIG. 6(a), after forming a thermally oxidized film as a silicon oxide layer 2 and a $Si_3N_4$ layer as a polishing stopper layer 3 on a semiconductor substrate 1 that is made of silicon, protrusion patterns 61–63 including the pattern 61 actually used as a circular pattern, and dummy patterns 71a–71c and 72a–72c were formed simultaneously by an etching step using a resist process such that the area ratio of the stopper layer 3 per unit area is greater than a predetermined ratio, irrespective of the location on the wafer. In this case, as the conditions when a microwave etching device was used, the following conditions were employed for instance.

Gas system used: $C_2Cl_3F_3/SF_6$=60/10 (sccm)

Microwave power: 850 (W)

RF power: 150 (W)

Pressure: 1.33 (Pa)

(2) Then, the trenches were buried by a CVD process. In this example, trenches were buried by using the silicon oxide film using a bias ECR-CVD process braving a high burying performance and providing satisfactory burying flattened shape. As the bias ECR-CVD conditions in this case, the following conditions were employed for instance.

Gas system used: $SiH_4/N_{20}$=20/35 (sccm)

Microwave power: 1000 (W)

RF power: 500 (W)

Magnetic flux density: $8.75\times10^{-2}$ (T)

Pressure: $9.3\times10^{-2}$ (Pa)

Thus, a structure as shown in FIG. 6(b) was obtained. Reference numeral 51 denotes a burying material on the wide protrusion region, while 52 denotes a burying material on the narrow protrusion region.

Figure 6C:
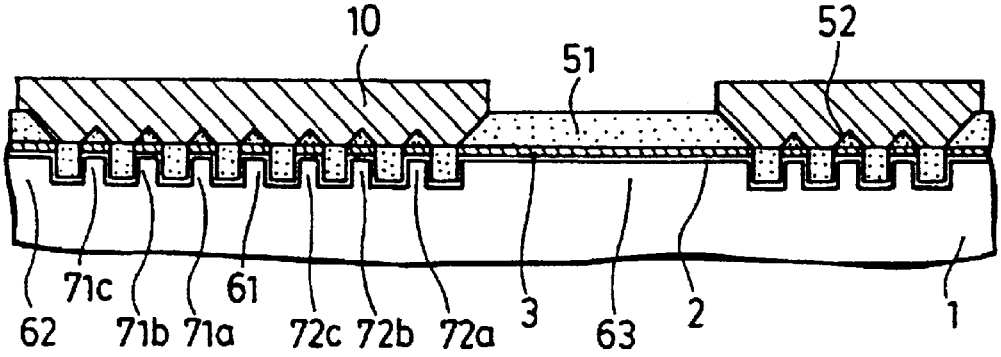

(3) Then, as shown in FIG. 6(c), resist 10 was formed by patterning on portions other than the wide (long) protrusion region.

(4) The silicon oxide film 51 as an excess burying material 5 on the wide (long) protrusion region was removed by isotropic etching. As the etching conditions in this case, the following conditions were used) for instance.

Liquid etching by HF: $H_2O$= 1:40

The selection ratio between $SiO_2$ and $Si_3N_4$ in this case was about 8:1.

Figure 6D:
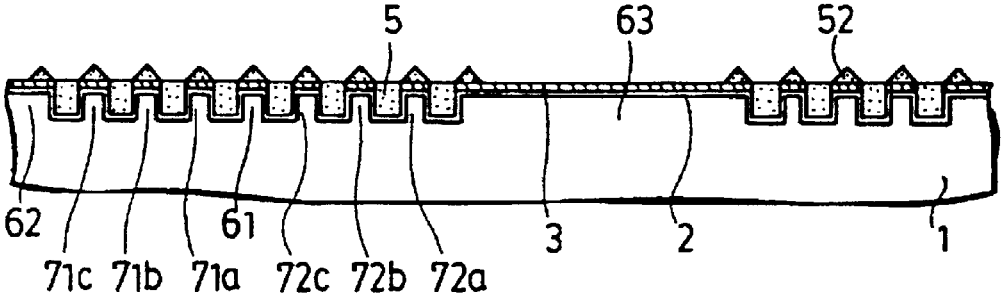

Further, the excess silicon oxide film 51 on the wide (long) protrusion region could be etched with no trouble at all till the underlying $Si_3N_4$ layer 3 was exposed. Subsequently, the resist 10 was removed. Thus, a structure as shown in FIG. 6(d) was obtained.

Figure 6E:
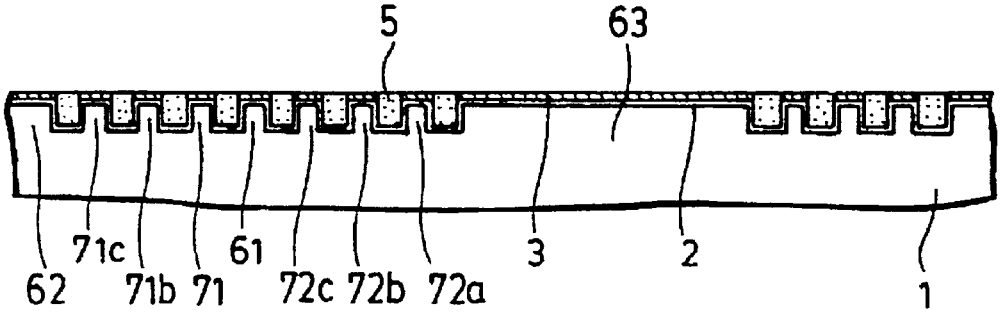

(5) Then excess protruding silicon oxide film 52 formed in the step (4) above was removed by polishing. Since only the excess protruding silicon oxide 52 was flattened by polishing in this case, the polishing time could be shortened and, since the polishing selection ratio of $Si_3N_4$ to $SiO_2$ was 5:1, $Si_3N_4$ could serve sufficiently as the stopper layer, a satisfactory flattened shape as shown in FIG. 6(e) was obtained. In this example, the present invention was applied to the formation of an integrated semiconductor device and, in particular, to the formation of trench isolation structure therein.

Figure 7A:
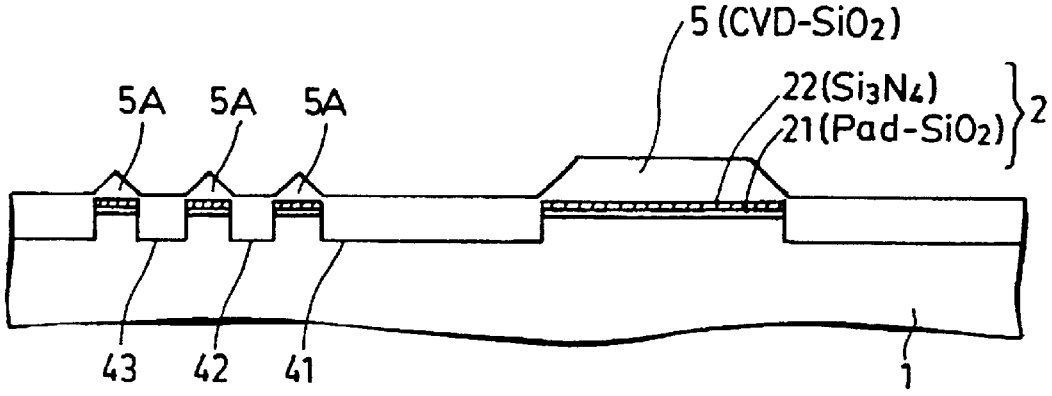
FIG. 7(a)–(f) shows steps in Example 8.
Figure 7B:
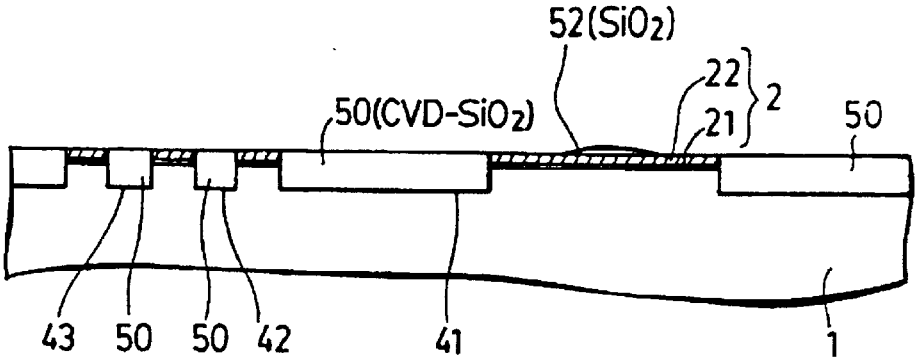
Figure 7C:
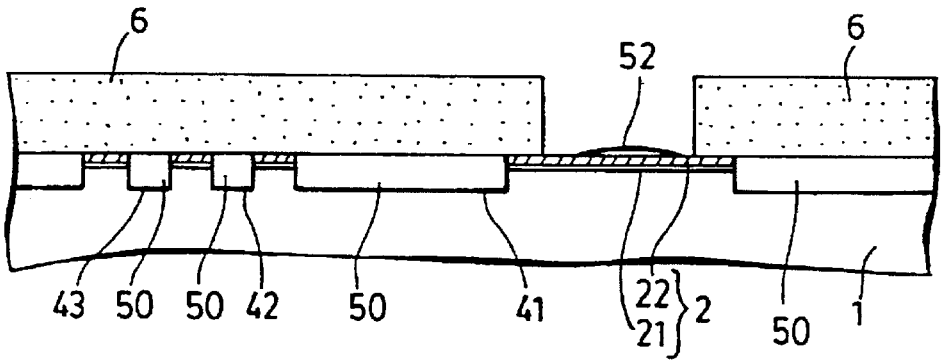
Figure 7D:
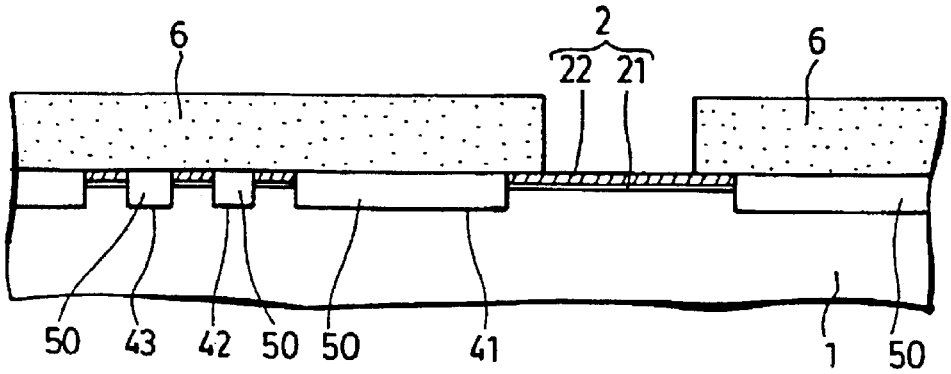

In this example, a structure as shown in FIG. 7(a) was obtained by a burying step of burying a plurality of recesses 41–43 on a substrate 1 by a bias ECR-CVD process as a deposition means for simultaneously conducting etching and deposition. Then, a structure as shown in FIG. 7(c) was obtained by conducting a polishing step to flatten the burying material by polishing (as shown in FIG. 7(b)), a resist forming step of forming a resist on the substrate after the polishing step and a resist pattern forming step of exposing the burying material remaining in the portions other than the recesses to be buried (where the burying material 52 is not removed completely) as shown in FIG. 7(c). Subsequently, a removing step of removing the burying material 52 remaining in the portions other than the recesses to be buried was conducted using a resist pattern 6 as a mask thereby attaining a satisfactory burying and flattening with the residue of the burying material removed completely, as shown in FIG. 7(d).

More specifically, this example was put to the following steps (1)–(6).

(1) A lower layer 21 as a $SiO_2$ pad made of a thermally oxidized film (T-$SiO_2$) and an upper layer 22 made of a silicon nitride ($Si_3N_4$) film were formed on a substrate 1 (silicon substrate in this example) to constitute a stopper layer 2. Further, recesses 41–43 as trenches were formed and a $SiO_2$ film was formed in the Si trenches to the same thickness as the depth of the trenches by means of a bias ECR-CVD process to form a layer of a burying material 5. Thus, a structure as shown in FIG. 7(a) was obtained. As the CVD conditions in this case, the following conditions can be used, for instance.

Microwave= 1000 W

RF= 500 W $SiH_4/N_2O$= 21/35 sccm

Magnetic field= $8.75\times10^{-4}$ T

Pressure $9.3\times10^{-2}$ Pa ($7\times10^{-4}$ Torr)

(2) Then, a polishing step was performed by a polisher, such as the device as shown in FIG. 3. Polishing was conducted under these conditions: speed of rotation of a polishing plate P= 37 rpm, speed of rotation of a wafer holder specimen table 64=17 rpm, polishing pressure (shown by the arrow 66 in FIG. 3)= $5.5\times10^3$ Pa (8 psi), slurry introduction rate from a slurry introduction pipe 61=225 ml/min and temperature of the pad 67= 40° C. As a slurry (shown schematically by 62 in FIG. 3), a mixture of silica, KOH and water can be used. For instance, as a polishing solution (slurry) used for polishing. SC-1 (a name of a product manufactured by Cabot Corporation) can be used. The solid ingredient is silica (30% based on the entire weight) (PH: 10.5–10.7, silica grain size: 25–35 rpm, pH controller: KOH). SC-1 is diluted to 15–20 times with deionized water and it can be used under pH control by a solution of diluted hydrofluoric acid or KOH and NAOH. In FIG. 3, are shown a rotational shaft 63 for the polishing plate P, a rotational shaft 65 for the wafer holder specimen table 64 that supports a wafer as a substrate 10 to be polished.

Figure 12A:
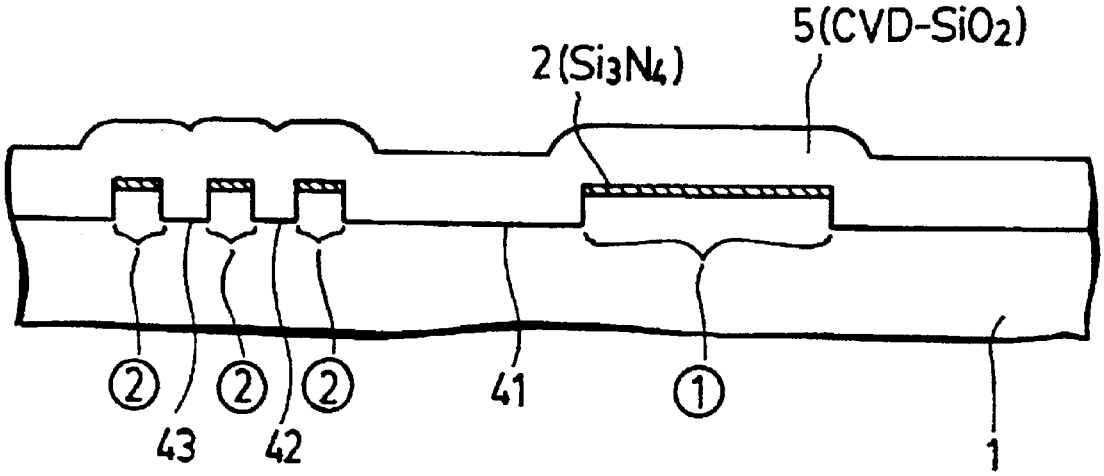
FIG. 12(A)–(B) shows problems in the prior art.
Figure 12B:
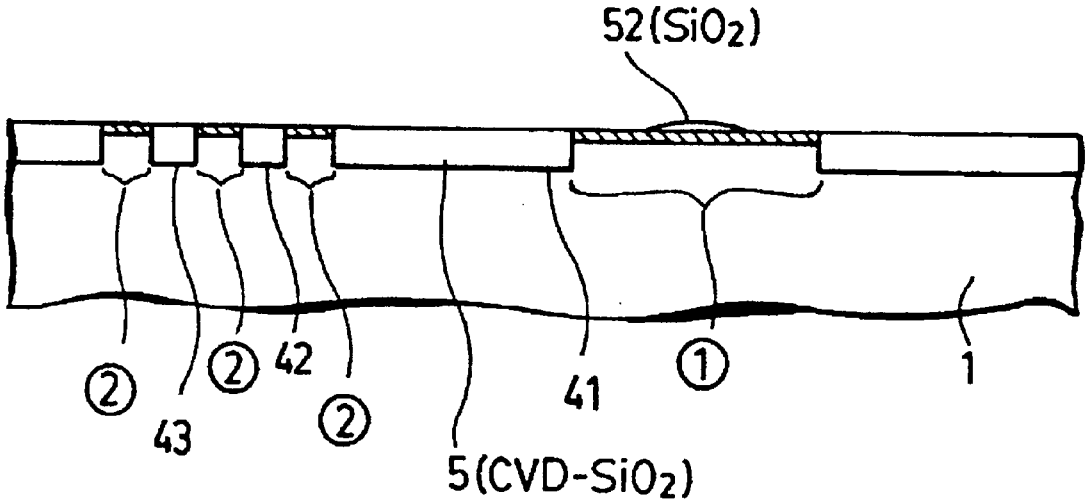
Figure 13A:
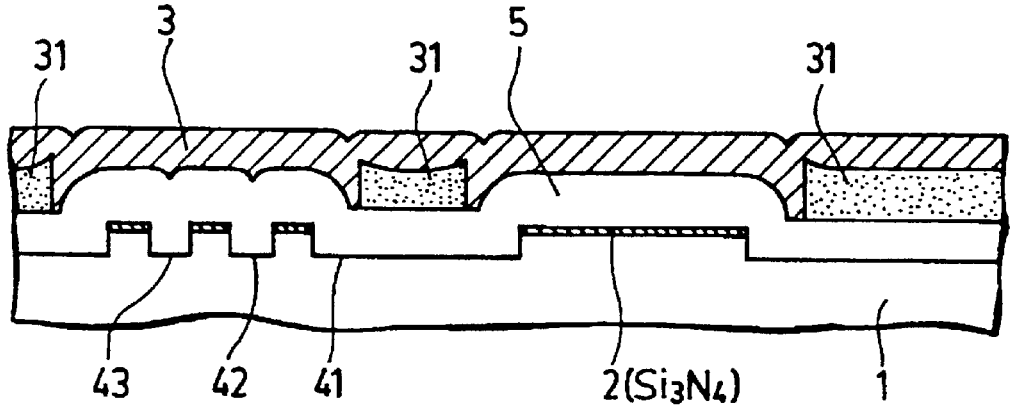
FIG. 13(a)–(e) shows problems in the prior art.
Figure 13B:
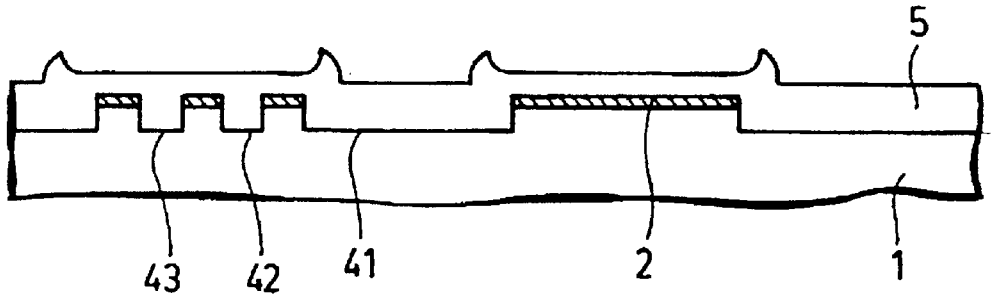
Figure 13C:
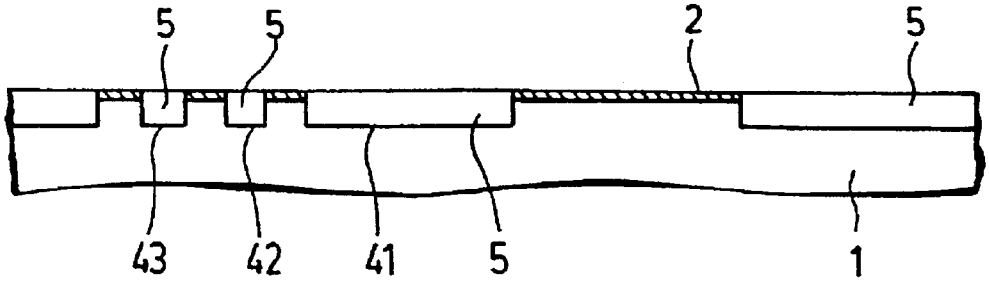
Figure 13D:
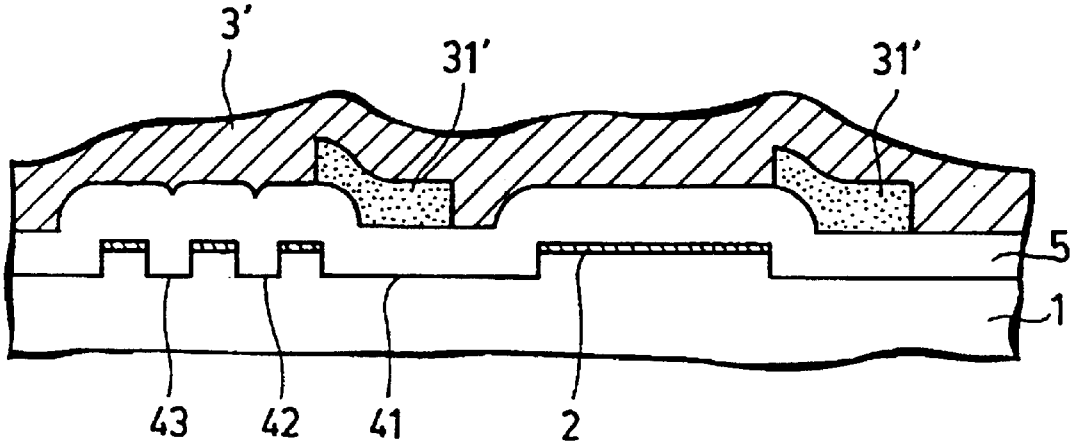
Figure 13E:
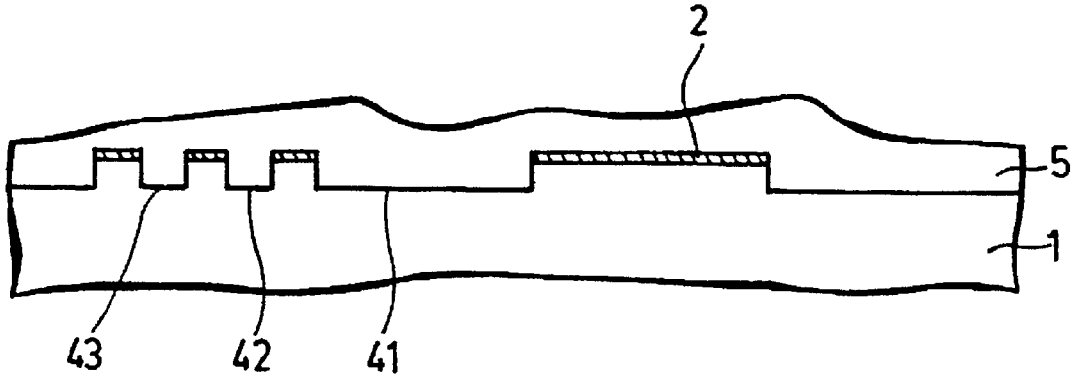

In this case, the shape of the $SiO_2$ protrusion 5A as the burying material 5 on the narrow protrusion regions (FIG. 7(a)) on the surface to be polished can be formed only by the bias ECR-CVD capable of conducting sputter etching and CVD simultaneously but such protruding shape can not be formed by conformal CVD. Since such protruding shape of $SiO_2$ can be polished easily, a structure of $SiO_2$ 52' which can not be removed completely but which remains on the narrow protrusion region (line and space pattern) as in the prior art (FIG. 12(b)), does not occur in the case of using the bias ECR-CVD. A structure as shown in FIG. 7(b) was obtained by the polishing step. Reference numeral 50 denotes the material buried in the recesses 41–43.

(3) A resist was patterned in the portions other than the central portion on a long protrusion to obtain a structure having a resist pattern 6 as shown in FIG. 7(c). Since the patterning is not fine patterning, a sufficient margin is available for aligning accuracy.

(4) Remaining (not removed completely) $SiO_2$ that is not masked with the resist pattern 6 was etched to obtain a structure as shown in FIG. 7(d). The remaining $SiO_2$ portion may be removed by wet etching using HF, or it may be removed by etching using RIE, for example, magnetron RIE under the following conditions.

$C_4F_8$= 50 sccm

RF= 1200 W

Pressure= 2 Pa (5) Then, the resist 6 was removed. The resist 6 may be removed using a RA stripper or using an ECR asher under the following conditions.

Figure 7E:
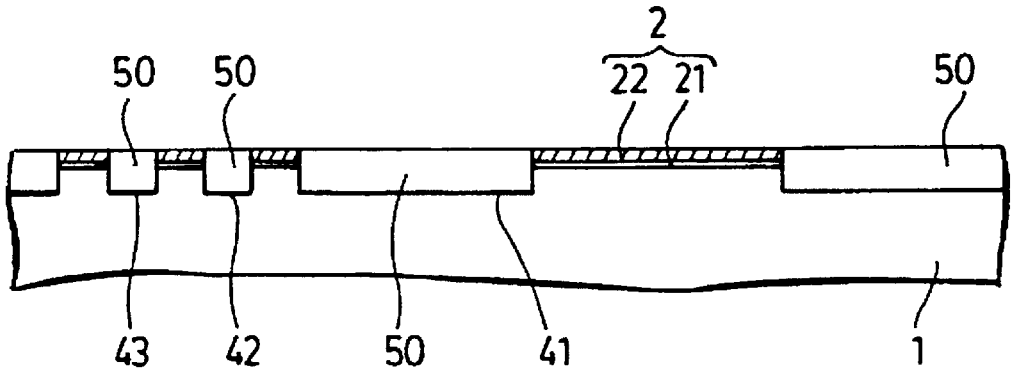

Thus, a structure as shown in FIG. 7(e) was obtained.

$O_2/CHF_3$= 400/20 sccm

Pressure= 1.9 Pa (1.4 Torr)

Microwave= 400 mA

Substrate temperature= 150° C.

Figure 7F:
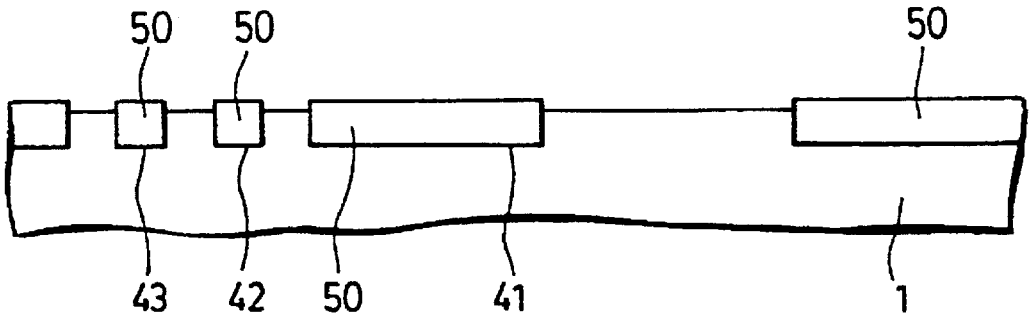

(6) Then, $Si_3N_4$ as the upper layer 22 of the stopper layer 2 was removed, for example, with KOH and the pad-$SiO_2$ as the lower layer 21 was removed with hydrofluoric acid to obtain a structure as shown in FIG. 7(f).

EXAMPLE 9

A description will now be made of Example 9'. In this example, the present invention was embodied in the formation of trench isolation for manufacturing a semiconductor device. In Example 1, since the resist was patterned, the lithographic step therefor took much time but the patterning could be saved in this Example 9. This example was put to the following steps (1)–(4).

Figure 8A:
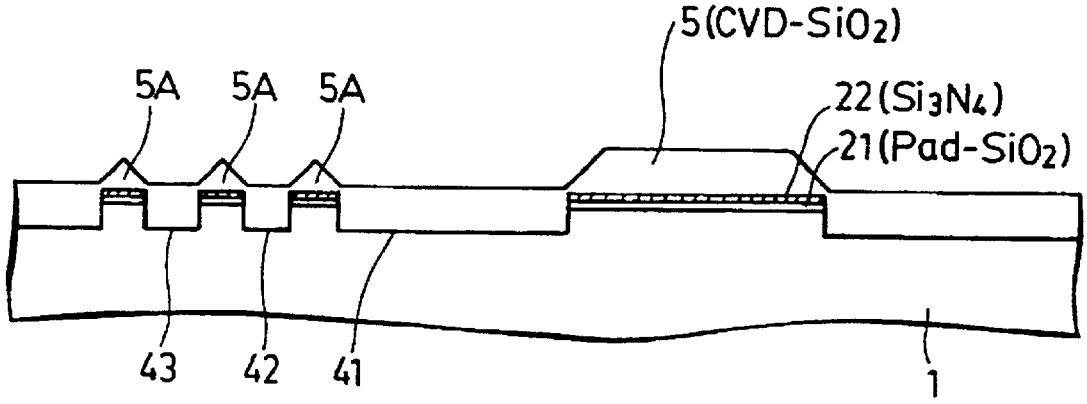
FIG. 8(a)–(e) shows steps in Example 9.

(1) In the same manner as in Example 8, a structure as shown in FIG. 8(a) was obtained by forming a $SiO_2$ film as a burying material 5 by means of bias ECR-CVD process in Si trenches to the same thickness as the depth of trenches in which a pad $SiO_2$ as a lower layer 21 and $Si_3N_4$ as an upper layer 22 were formed. The CVD conditions in this example may be the same as those in Example 8.

Figure 8B:
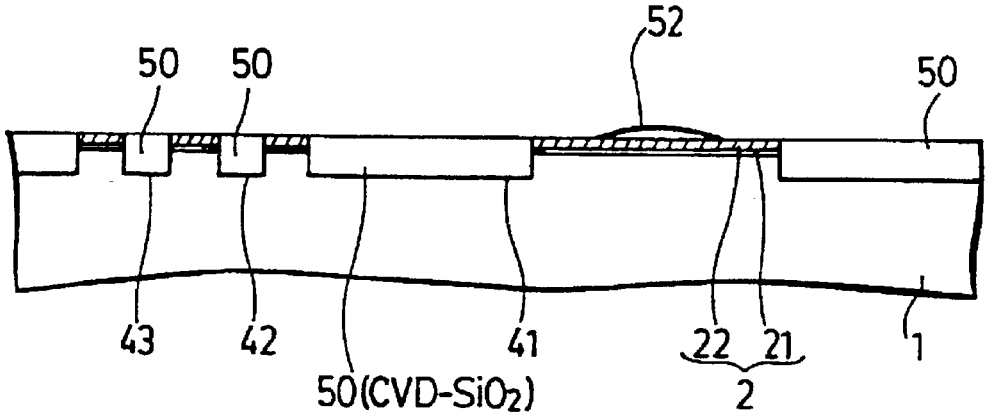

(2) Polishing was performed by using a polisher to obtain a structure as shown in FIG. 8(b). The polishing conditions in this case may be the same as those in Example 8.

Figure 8C:
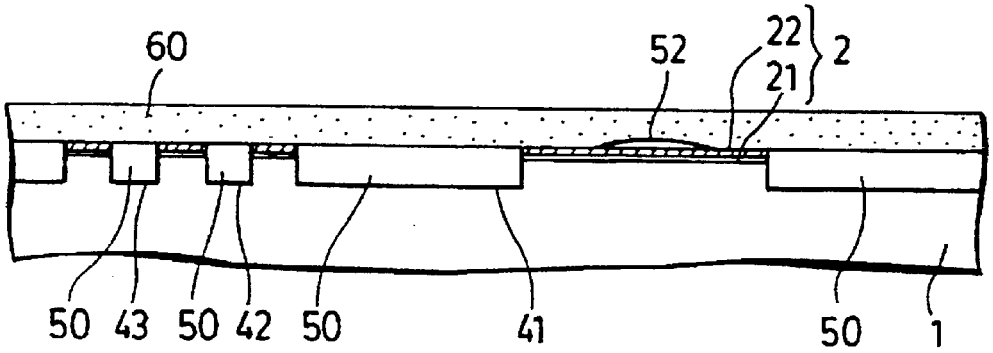

(3) A resist was coated to obtain a structure as shown in FIG. 8(c). For instance, the resist was coated under the following conditions.

Resist= OFPR-800, manufactured by Tokyo Ohka Co.

Viscosity= 0.02 Pa.s

Speed of rotation= 8000 rpm

Further, SOG (spin on glass) may be used instead of the resist and the process can be practiced under the following conditions.

SOG= type-2, manufactured by Tokyo Ohka Co.

Speed of rotation=200 rpm

Rotational time= 15 s

Baking temperature= 500° C.

Figure 8D:
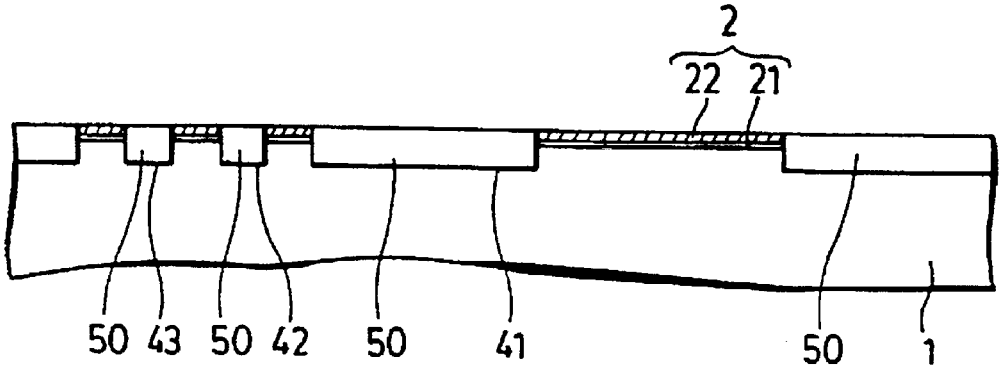
Figure 8E:
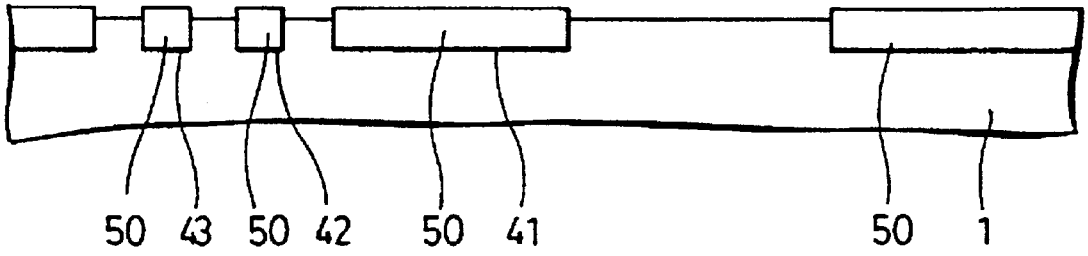

Baking time= 300 min (4) Etching back was applied at a ratio of resist $SiO_2$=1:1, to etch back the resist 6 and the remaining $SiO_2$ 52. Thus, a structure as shown in FIG. 8(d) was obtained. The etching could be applied by using, for example, a parallel flat plate RIE device under the following conditions.

$CHF_3$=500 sccm $O_2$= 70 sccm

RF power= 1200 W

Pressure= 30 Pa

Etching back at a ratio of SOG: $SiO_2$= 1:1 can be conducted under the same conditions.

Since there was less residual $SiO_2$, $SiO_2$ could be removed sufficiently, even by such an etching back process.

(5) Then, $Si_3N_4$ as the upper layer 22 of a stopper layer 2 was removed, for example, with KOH and a pad $SiO_2$ as the lower layer 21 was removed with hydrofluoric acid to obtain a structure as shown In FIG. 16(e).

EXAMPLE 10

In this example, the present Invention was applied to a method of manufacturing an integrated semiconductor device formed with trench isolation. FIGS. 9(a)–9(f) show the steps in this example.

Figure 9A:
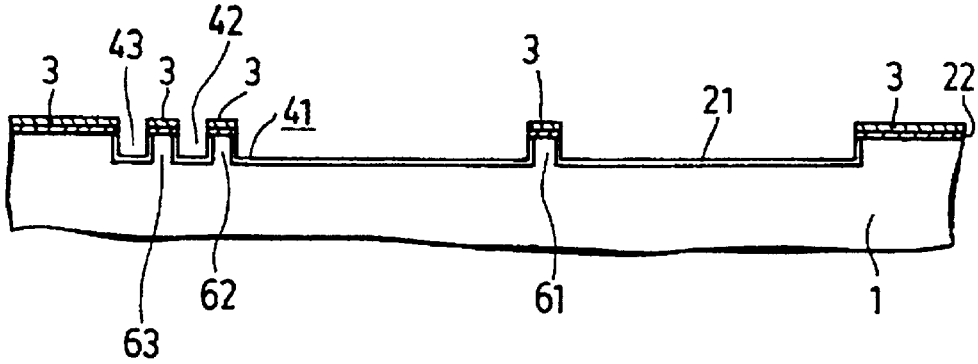
FIG. 9(a)–(f) shows steps in Example 10.
Figure 9B:
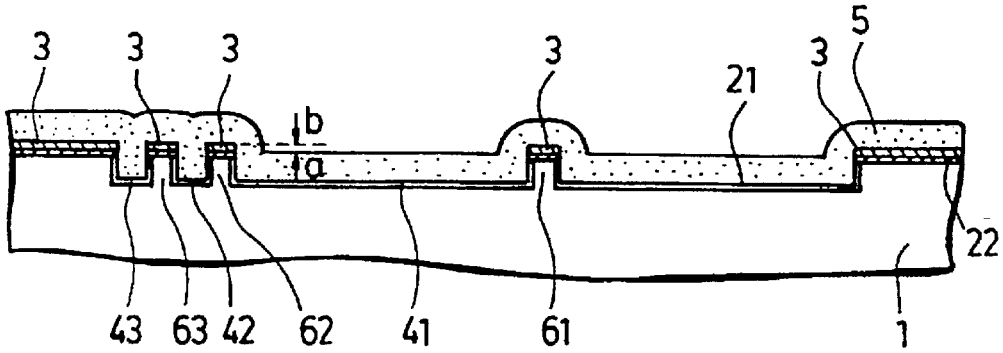
Figure 9C:
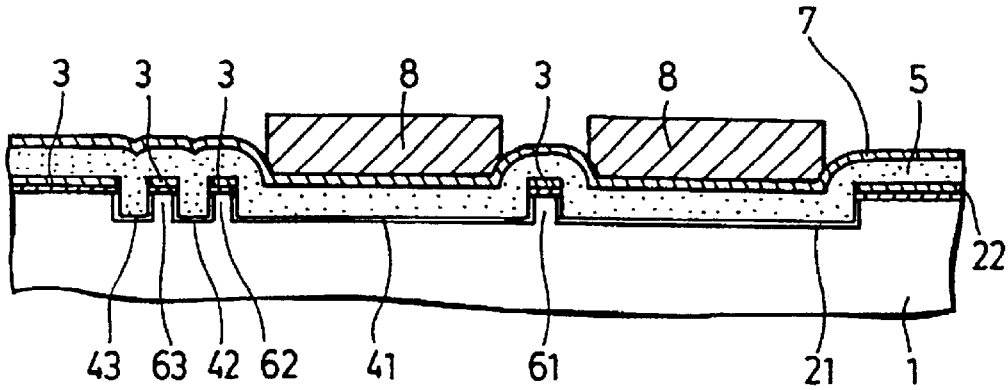
Figure 9D:
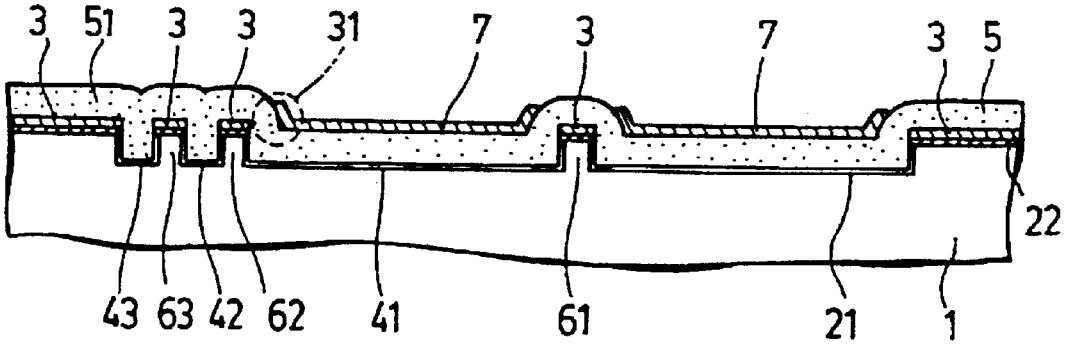

In this example, a plurality of protrusion patterns 61–63 each having a polishing stopper layer 3 in the upper portion were formed as shown in FIG. 9(a) and recesses 41–47 defined by the plurality of protrusion patterns were buried by a burying material 5 as shown in FIG. 9(b). After burying the recesses, a second polishing stopper layer 7 was formed at least on the burying material 5 in the recess of the portion in which the density of the polishing stopper layer 3 was sparse (wide recess) 41 as shown in FIG. 9(c) and FIG. 9(d) (in this example, after forming the second polishing stopper layer 7 over the entire surface as in FIG. 9(c) and, subsequently, the second polishing stopper layer 7 was left only on the burying material 5 in the wide recess 41 by an etching step using a resist 8 as shown in FIG. 9(d). Then, a step of flattening the burying material formed on the protrusion pattern with polishing was conducted.

As a result, since the second polishing stopper layer 7 was formed on the burying material 5 in the wide recess 41 also on the portion in which the density of the polishing stopper layer 3 was sparse from the initial stage, no excess polishing proceeds even near the isolated protrusion pattern 61 and uniform and satisfactory flattening could be attained by polishing.

Specifically, in this example, flattened trench isolation was formed by the following steps (1)–(6).

(1) As shown in FIG. 9(a), after forming a thermally oxidized film as a silicon oxide layer 21, a poly-Si layer as an etching stopper layer 22 for a $Si_3N_4$ layer which is a polishing stopper layer 3 and the $Si_3N_4$ layer as the polishing stopper layer 3 on a semiconductor substrate I such as made of silicon, recesses 41–43 as trenches were formed by a RIE (reactive ion etching) step using a resist process. As the RIE conditions in this case, the following conditions were employed for instance.

Gas system used: $C_2Cl_3F_3/SF_6$= 60/10 (sccm)

Microwave power: 850 (W)

RF power: 150 (W)

Pressure: 1.33 (Pa)

(2) Then, as shown in FIG. 9(b), a burying material 5 for burying the recesses 41–43 as-the trenches was formed, for example, from an organic silicon compound (for example, TEOS) and ozone ($O_3$) by a CVD process such that the film thickness in the recess 41 of the trench was smaller than the depth of the trench by the thickness of the polishing stopper layer (a in the figure). As the TEO $S/O_3$ CVD conditions, the following conditions were employed for instance.

Gas system employed: $TEOS/O_3$= 1000/2000 (sccm)

Growing temperature: 390 (° C.)

Pressure: $1.20\times10^4$ (Pa)

(3) Successively, as shown in FIG. 9(c), a silicon nitride film as a second polishing stopper layer was formed. The thickness of the silicon nitride film in this case was set such that the thickness of the silicon oxide film and the thickness of the silicon nitride film in the trench recess 41 (a+ b in the figure) was made equal with the trench depth. As the conditions for forming the silicon nitride film, the following conditions were employed for instance.

Gas system used: $SiH_2Cl_2/NH_3$=50/200 (sccm)

Growing temperature: 760 (° C.)

Pressure: 70 (Pa).

In this case, as shown in FIG. 9(c) a resist pattern 8 was formed in order to remove the second polishing stopper layer 7 formed on the portions other than the wide recess 41 of the trench.

(4) Then, an excess silicon nitride film was etched by isotropic etching. Thus, as shown in FIG. 9(d), the second polishing stopper layer 7 was left only on the burying material 5 in the wide recess 41. The etching was conducted in this case under the following etching conditions, for instance.

Etching solution used: phosphoric acid

Temperature: 150 (° C.)

(The selection ratio between the silicon nitride film and the silicon oxide film was about 50:1)

Figure 9E:
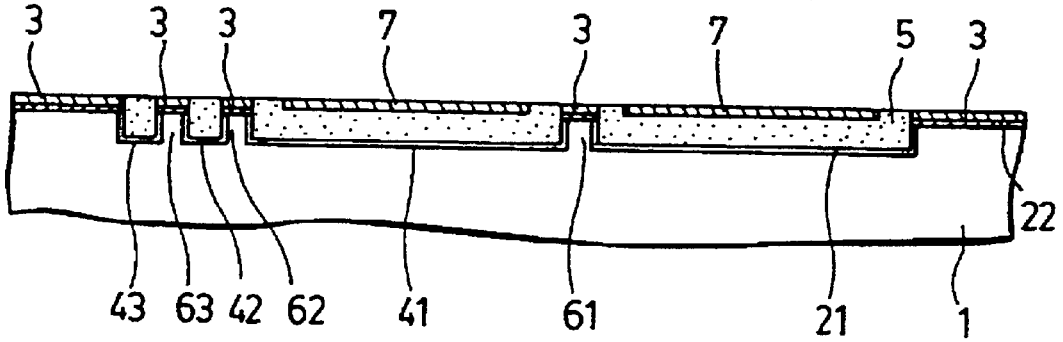

(5) The $SiO_2$ that is the excess burying material 5 formed on the protrusion of the trench and the silicon nitride film that is the second polishing stopper layer 7 left in the form of a protrusion on the trench recess 41 (indicated by a protrusion 31) were removed and flattened by polishing. Thus, a structure as shown in FIG. 9(e) was obtained. In this case, a customary device as shown in FIG. 3 was used as the polishing device. The polishing was conducted in this case under the following polishing conditions for instance.

Speed of rotation of polishing plate: 37 (rpm)

Speed of rotation of wafer holder specimen table: 17 (rpm)

Polishing pressure: $5.5\times10^5$ (Pa)

Slurry flow rate: 225 (ml/min)

Pad temperature: 40 (° C.)

Slurry: Silica (0.025–0.03 $\mu$m)

KOH (PH<10.5)

Water

In the polishing step, since the selection ratio between the polishing stopper layers 3, 7 ($Si_3N_4$) and the burying material 5 ($SiO_2$) was at $SiO_2/Si_3N_4$=4–6, and the area ratio of $Si_3N_4$ as the stopper material per unit area was greater than a predetermined ratio irrespective of positions on the wafer, a sufficiently flattened shape could be obtained with no over polishing for the isolation pattern 61.

Further, in flattening by the polishing method, it has been generally known that protrusion has much greater polishing rate than that of a flattened portion made of an identical material and, for instance, if a protrusion 31 shown in FIG. 7(d) should occur, a satisfactorily flattened shape is obtained.

(6) Then, etching back was conducted entirely by magnetron RIE using poly-Si of the etching stopper layer 22 as a stopper. As the etching conditions in this case, the following conditions were employed, for instance.

Gas system used: $C_3F_8/O_2$=45/15 (sccm)

RF power: 1200 (W)

Pressure: 2 (Pa)

Figure 9F:
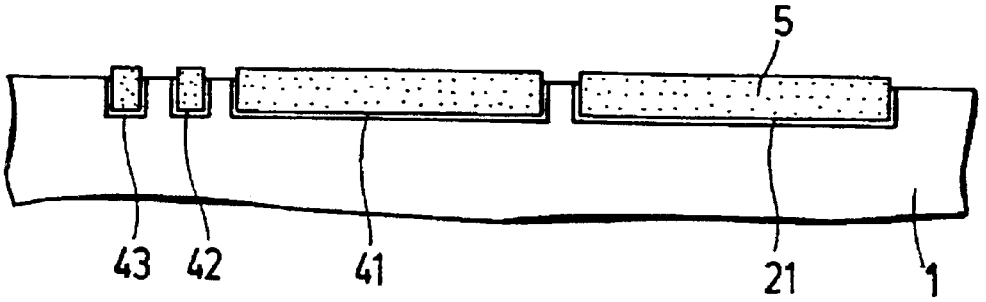

Finally, poly-Si as the etching stopper layer 22 and $SiO_2$ as the silicon oxide layer 21 were removed with KOH and hydrofluoric acid respectively. Thus, trench isolation as shown in FIG. 9(f) was completed.

EXAMPLE 11

In this example, the present invention was applied to trench isolation. In Example 10, atmospheric CVD and vacuum CVD were used for forming a burying oxide film and a polishing stopper layer. In this example, a bias ECR-CVD process (this method is suitable as burying and flattening technique since etching and deposition are conducted simultaneously) was, applied to the formation of the buried and flattened film and the second polishing stopper layer, thereby forming a polishing stopper layer 7 over the entire surface of a recess 41 as a trench. The following steps (1)–(7) were conducted.

Figure 10A:
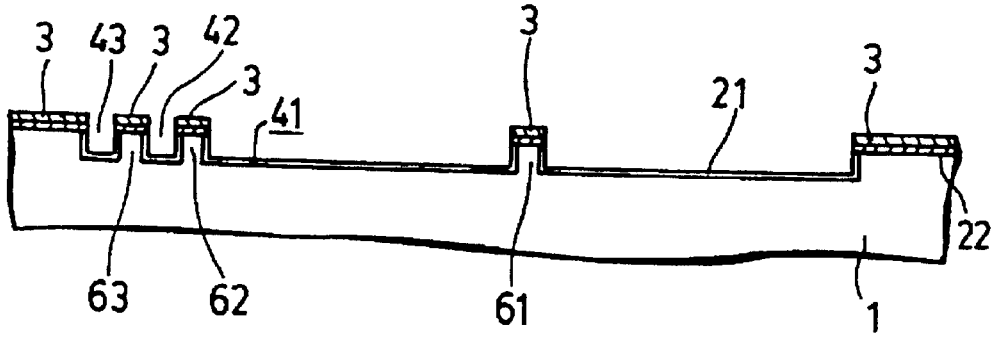
FIG. 10(a)–(g) shows steps in Example 11.

In the same manner as in Example 10, after forming a thermally oxidized film 21 as a silicon oxide layer, a poly-Si layer 22 as an etching stopper layer for a $Si_3N_4$ layer as a stopper layer 3 for polishing and the $Si_3N_4$ layer as the polishing stopper layer 3 on a semiconductor substrate 1 such as made of silicon trenches were formed by a RIE (reactive ion etching) step using a resist process. Then, a structure as shown in FIG. 10(a) was obtained. As the RIE conditions in this case, the following conditions were employed, for instance.

Gas system used: $C_2Cl_3F_3/SF_6$=60/10 (sccm)

Microwave power: 850 (W)

RF power: 150 (W)

Pressure: 1.33 (Pa)

Figure 10B:
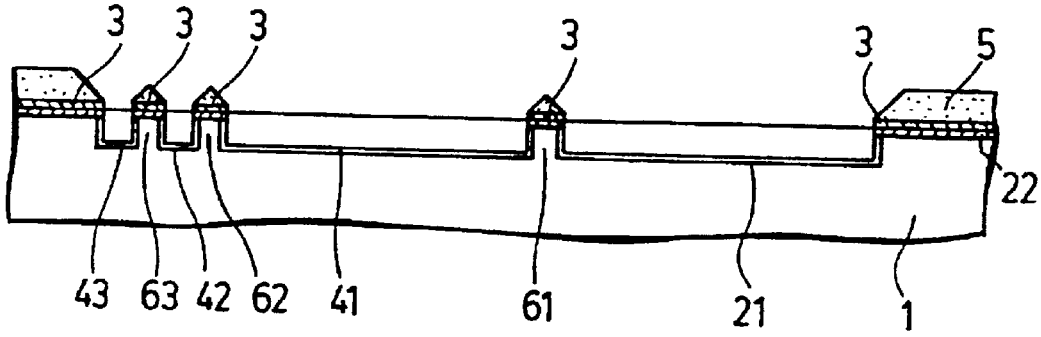

(2) Then, a silicon oxide film was buried as a burying material 5 in trench recesses 41– 43 by a bias ECR-CVD process having a high burying performance and providing a satisfactory buried and flattened shape. The buried film was formed such that the film thickness in the trench recesses 41–43 was less than the trench depth by the thickness of the polishing stopper layer 3 as shown in FIG. 10(b). As the bias ECR-CVD conditions in this case, the following conditions were employed, for instance.

Gas system used: $SiH_4/N_2O$= 20/35 (sccm)

Microwave power: 1000 (W)

RF power: 500 (W)

Magnetic flux density: $8.75\times10^{-2}$ (T)

Pressure: $9.3\times10^{-2}$ (Pa)

Figure 10C:
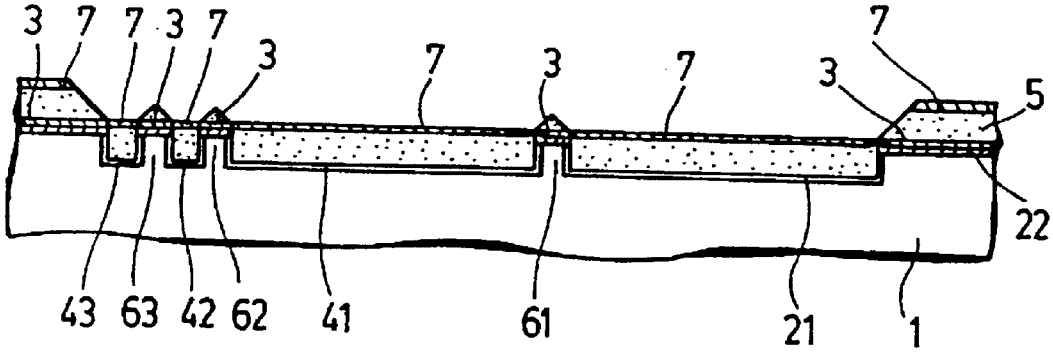

(3) Successively, a silicon nitride film as the polishing stopper layer 3 was formed by a bias ECR-CVD process. The silicon nitride film was formed to such a thickness as at least greater than the thickness of the polishing stopper layer 3 upon forming the trenches. Thus, a structure as shown in FIG. 10(c) was obtained. As the bias ECR-CVD conditions in this case, the following conditions were employed, for instance.

Gas system used: $SiH_4/N_2/Ar$= 20/20/15 (sccm)

Microwave power: 550 (W)

RF power: 200 (W)

Magnetic flux density: $8.75\times10^{-2}$ (T)

Pressure: $2.0\times10^{-1}$ (Pa)

Since the bias ECR-CVD process utilizes a simultaneous competing reaction between deposition and etching (sputter etching), it is dependeneoe the angle. Accordingly, the film was not formed in the regions other than those having a certain angle relative to the horizontal plane of the substrate and provided a shape of the film as shown in FIG. 10(c).

Figure 10D:
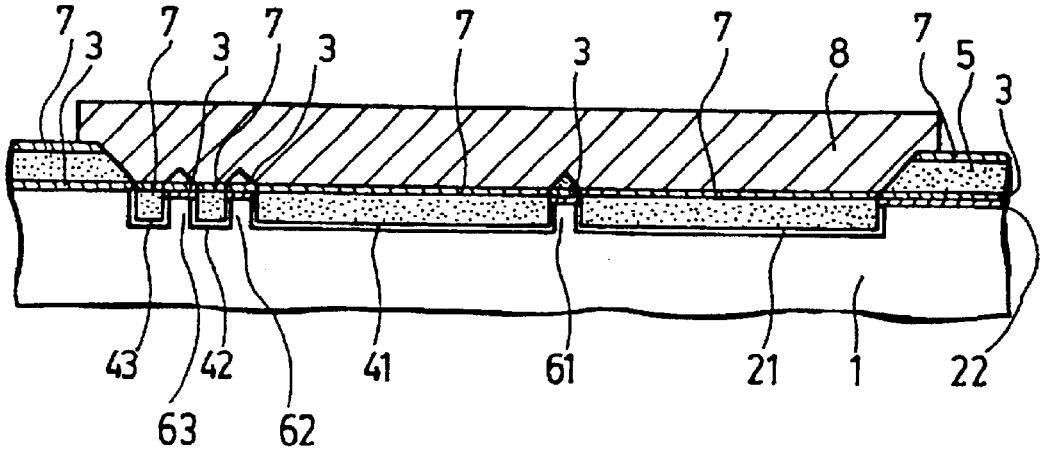

(4) As shown in FIG. 10(d), a resist 8 was formed by patterning over the portions other than the long trench protrusions (the protrusion on the right and left in the figure) as shown in FIG. 10(d).

(5) At first, silicon nitride films on the right and left in the figure,as the second polishing stopper layer 7 formed on the protrusions of the long trenches were removed by isotropic etching using the resist 8. As etching conditions in this case, the following conditions were used, for instance.

Etching solution used: Phosphoric acid

Temperature: 150 (° C.) (selection ratio between the silicon nitride film and the silicon oxide film was about 50:1)

Then, successively, the silicon oxide film as the excess burying material on the long protrusion was removed by isotropic etching. As the etching conditions in this case, the following conditions were employed, for instance. Etching solution used: $HF:H_2O$= 1:40

Temperature: 150 (° C.)

(selection ratio between the $SiO_2$ film and the $Si_3N_4$ film was about 8:1)

Figure 10E:
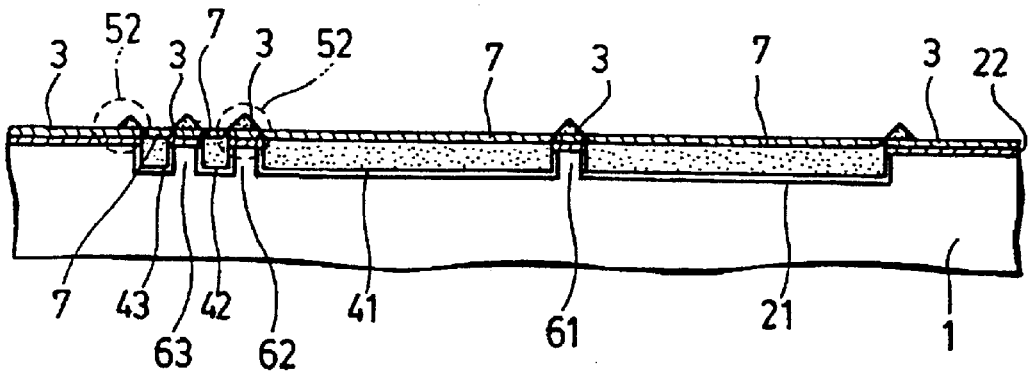

In this case, the excess silicon oxide film on the long protrusion was under lying polishing stopper layers 3 and 7. Etching could be performed with no problem at all until the $Si_3N_4$ film was exposed. Subsequently, the resist 8 was removed. Thus, a structure as shown in FIG. 10(e) was obtained.

Figure 10F:
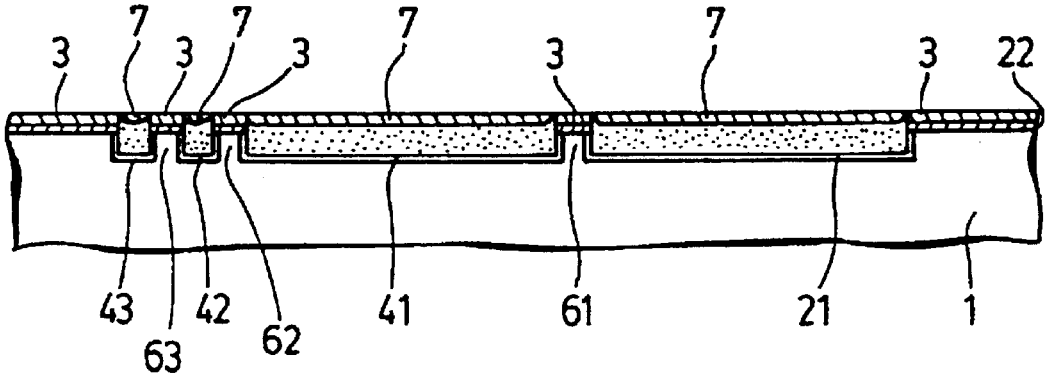

(6) The excess silicon oxide film 52 in the form of protrusions formed in the preceding step (5) were removed by polishing. Since only the excess protruding silicon oxide film 52 was flattened, the polishing time could be shortened. Further, since the area ratio of the polishing stopper layers 3, 7 ($Si_3N_4$) per unit area was greater than a predetermined ratio, irrespective of the location on the wafer, it was possible to obtain a sufficiently flattened shape without over polishing the isolation pattern 61 (refer to FIG. 14(e)). Thus, a structure as shown in FIG. 10(f) could be obtained.

(7) Then, etching back was applied for the entire surface by magnetron RIE under the conditions of $SiO_2$ and $Si_3N_4$ selection ration at 1:1. As the etching back conditions in this case, the following conditions were employed, for instance.

Gas system used: $C_2F_8$=45/15 (sccm)

RF power: 1200 (W)

Pressure: 2 (Pa)

Figure 10G:
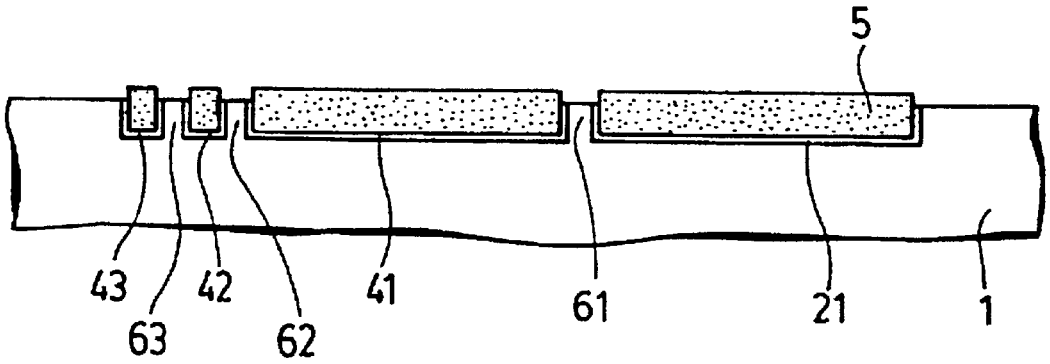
Figure 11A:
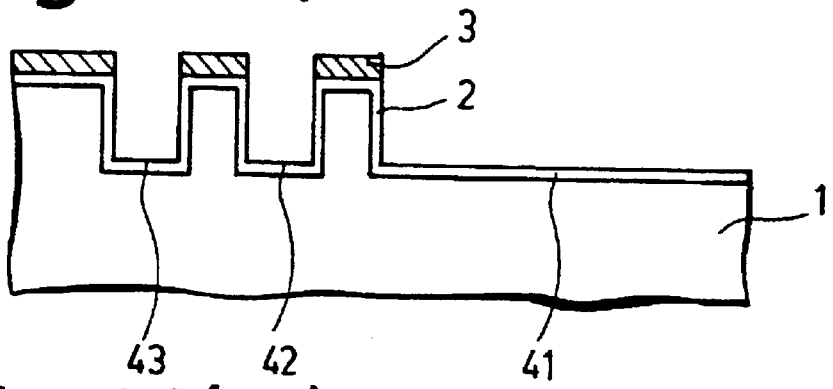
FIG. 11(A)–(C) shows steps in the prior art.
Figure 11B:
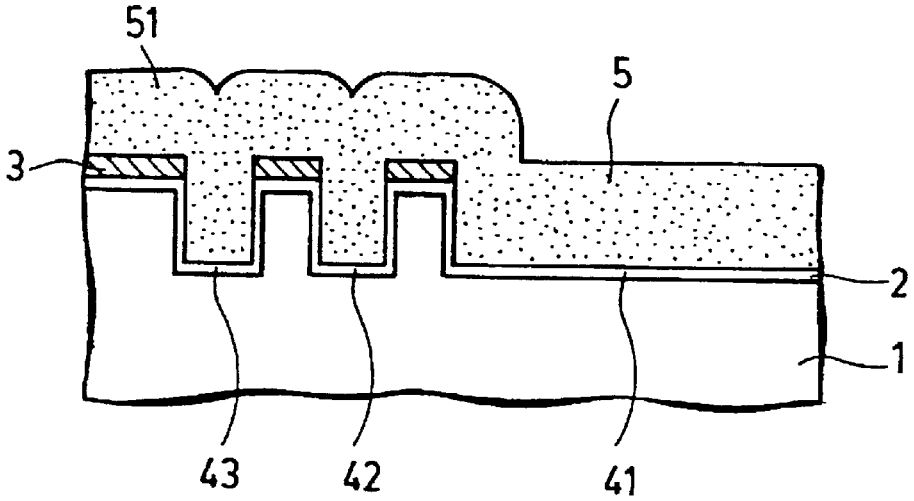
Figure 11C:
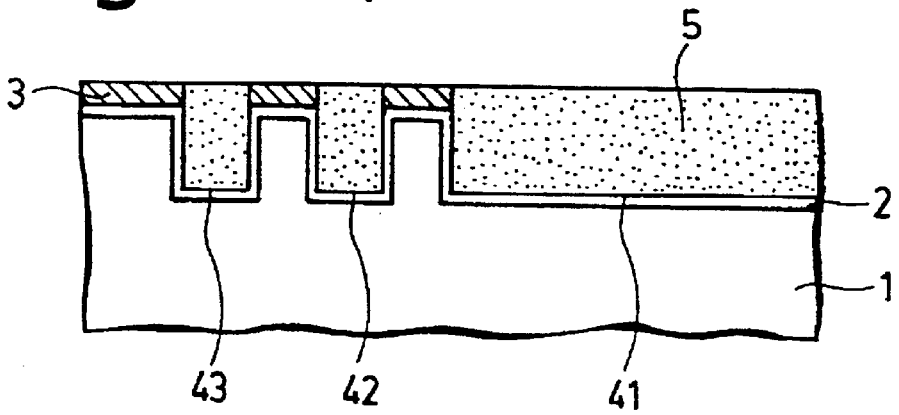

Finally, poly-Si, $SiO_2$ forming the layer 22, etc. were removed by hot phosphoric acid and hydrofluoric acid respectively. Thus, trench isolation as shown in FIG. 10(g) was completed.

It will be apparent that the present invention is not restricted only to the examples but each of the constitutions may be selected properly unless it goes beyond the scope of the invention. For instance, the polishing stopper layer may take various modes such that the material, processing conditions, etc. can be appropriately varied so long as the polishing stopper layer has a polishing rate lower than that of the burying material layer.

According to the present invention, flattening can be attained without leaving the burying material on a wide (long) protrusion region, whereby It is possible to provide a means capable of forming trench isolation of satisfactory flatness, as well as a means for manufacturing a semiconductor device formed with such trench Isolation.

Further, according to the present invention, it is possible to provide a method of manufacturing a semiconductor device having a polishing step for conducting flattening after burying, wherein satisfactory flattened shape can be formed even in a portion in which the area ratio of a stopper layer per unit area is low in a case where there is unevenness in the distribution of a portion showing a function of a polishing stopper on the portion to be polished.

We claim:

1. A method for manufacturing a semiconductor device having trench isolation structures in trenches in a substrate having wide and narrow protrusions between the trenches, comprising the steps of:

burying the trenches by a deposition means by conducting etching and deposition of a burying material simultaneously on the substrate resulting in narrow build-up of burying material on the narrow protrusions and wide build-up of burying material on the wide protrusions;

applying a resist on the substrate;

forming a resist pattern in the resist to expose a surface of the burying material only on the wide protrusions while leaving the burying material on the narrow protrusions covered by the resist;

after said step of forming, at least an [isotropic] etching step for [isotropically] etching *the burying material on the wide protrusions* through openings in the resist; and a polishing step for flattening the *burying material on the narrow protrusions* and any remaining portions of the burying material on the wide protrusions by polishing.

2. A method of forming trench isolation structures as defined in claim 1, further comprising the steps of:

applying an etching stopper to the substrate, the etching stopper comprising a three-layered structure, said step of applying an etching stopper including:

applying an upper layer of said etching stopper layer of a film having a polishing rate slower than that of the burying material during the polishing step and an etching rate also slower than that of the burying material during the etching step, applying an intermediate layer of said etching stopper layer of a film having an etching rate slower than that of the upper layer during the etching step, and applying a lower layer of said etching stopper layer of a film having an etching rate slower than that of the intermediate layer and faster than that of the substrate.

* * * * *